United States Patent
Yoneda et al.

(10) Patent No.: US 8,900,903 B2
(45) Date of Patent: Dec. 2, 2014

(54) METHOD FOR PRODUCING OPTICAL SEMICONDUCTOR DEVICE

(71) Applicant: Sumitomo Electric Industries, Ltd., Osaka (JP)

(72) Inventors: Yoshihiro Yoneda, Isehara (JP); Hirohiko Kobayashi, Machida (JP); Ryuji Masuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/787,883

(22) Filed: Mar. 7, 2013

(65) Prior Publication Data

US 2013/0244363 A1 Sep. 19, 2013

(30) Foreign Application Priority Data

Mar. 13, 2012 (JP) ................. 2012-056079

(51) Int. Cl.
  *H01L 21/00* (2006.01)
  *H01S 5/042* (2006.01)
  *H01S 5/22* (2006.01)
  *H01S 5/028* (2006.01)
  *H01S 5/30* (2006.01)
  *H01S 5/20* (2006.01)

(52) U.S. Cl.
  CPC .............. *H01S 5/028* (2013.01); *H01S 5/0425* (2013.01); *H01S 5/22* (2013.01); *H01S 2301/176* (2013.01); *H01S 5/2086* (2013.01); *H01S 5/30* (2013.01)
  USPC ................... 438/40; 438/39; 438/22

(58) Field of Classification Search
  None
  See application file for complete search history.

(56) References Cited

U.S. PATENT DOCUMENTS

2010/0303115 A1* 12/2010 Yagi et al. ................ 372/46.012
2012/0313721 A1* 12/2012 Kohda ......................... 331/158

FOREIGN PATENT DOCUMENTS

JP 8-220358 8/1996

* cited by examiner

*Primary Examiner* — Charles Garber
*Assistant Examiner* — Brigitte Paterson
(74) *Attorney, Agent, or Firm* — Smith, Gambrell & Russell, LLP

(57) ABSTRACT

A method for producing an optical semiconductor device includes the steps of forming a semiconductor structure; forming a mask on the semiconductor structure; etching the semiconductor structure with the mask to form first and second stripe-shaped grooves and a mesa portion; forming a protective film on a top surface and side surfaces of the mesa portion; forming a resin portion on the protective film; etching the resin portion and the protective film formed on the top surface; forming an upper electrode on the top surface; and forming an electrical interconnection on the resin portion. The resin portion has an inclined surface region that rises from a first point above the mesa portion toward a second point above the first stripe-shaped groove. The step of etching the resin portion and the protective film includes the substeps of etching the resin portion and simultaneously etching the resin portion and the protective film.

9 Claims, 24 Drawing Sheets

METHOD FOR PRODUCING OPTICAL SEMICONDUCTOR DEVICE

BACKGROUND OF THE INVENTION

1. Field of the Invention

The present invention relates to a method for producing an optical semiconductor device.

2. Description of the Related Art

Japanese Unexamined Patent Application Publication No. 8-220358 discloses a waveguide-type optical semiconductor device provided with a ridge waveguide. In this document, grooves (stripe-shaped grooves) are formed on both sides of the ridge waveguide by etching. The etched grooves are filled with a material other than a semiconductor material for planarization. In addition, the width of the etched grooves is designed to an optimal value. As a result, the high-power performance and reliability of the optical semiconductor device can be improved.

SUMMARY OF THE INVENTION

A waveguide-type optical semiconductor device typically includes a stripe-shaped mesa portion. In the case of producing the mesa portion of the optical semiconductor device, typically, a stacked semiconductor layer including an active layer (core layer) and so forth is grown. A pair of stripe-shaped grooves are formed in the stacked semiconductor layer to form the mesa portion. After forming a protective film made of SiO$_2$ on exposed surfaces, an electrode is formed on the mesa portion. An electrical interconnection and a bonding pad are formed on portions of the stacked semiconductor layer other than the mesa portion. When the electrical interconnection partially located in the stripe-shaped grooves is formed, an optical loss due to the scattering and absorption of light propagating through the waveguide is disadvantageously increased. To avoid the problems, after the formation of the mesa portion, the pair of stripe-shaped grooves are filled with a resin to planarize a surface. Then the electrode, the electrical interconnection, and the bonding pad may be formed on the stacked semiconductor layer and the resin portions.

However, it was revealed that when an optical semiconductor device is produced by such a method, the electrical interconnection is easily broken for the reasons described below.

FIGS. 1A to 1C and 2A to 2C are cross-sectional views illustrating a method for producing an optical semiconductor device in a conventional method. As illustrated in FIG. 1A, a stacked semiconductor layer 103 including an active layer is formed on a semiconductor substrate 101, thereby forming a semiconductor structure 105 including the semiconductor substrate 101 and the stacked semiconductor layer 103. As illustrated in FIG. 1B, the semiconductor structure 105 is etched to form a pair of stripe-shaped grooves 121 and 122. The pair of stripe-shaped grooves 121 and 122 defines a mesa portion Mp and external portions Exp. As illustrated in FIG. 1C, a protective film 107 composed of, for example, silicon oxide, is formed on an exposed surface of the semiconductor structure 105.

As illustrated in FIG. 2A, a resin portion 111 is formed on the semiconductor structure 105 so as to cover the mesa portion Mp and the external portions Exp and to fill the pair of stripe-shaped grooves 121 and 122 with the resin portion 111. As illustrated in FIG. 2B, a mask (not illustrated) having an opening in a region of the mask located above the mesa portion Mp is formed. A region of the resin portion 111 is etched with the mask so as to expose a region of the protective film 107 located above the mesa portion Mp. To completely expose the region above the mesa portion Mp, the opening width of the mask is set so as to be greater than the width of the region above the mesa portion. Thereby, an etching groove 111P is formed above the mesa portion Mp. The etching groove is formed so as to have a greater width than the mesa width of the mesa portion Mp. As illustrated in FIG. 2C, the exposed protective film 107 is etched by, for example, a dry etching process to expose the top surface MpT of the mesa portion Mp. An upper electrode is formed on the top surface MpT of the mesa portion Mp. A pad electrode is formed on the resin portion 111 located above one of the external regions Exp. An electrical interconnection to electrically connect the upper electrode and the pad electrode is formed on the resin portion 111 in the stripe-shaped groove 121.

As illustrated in FIG. 2C, when the protective film 107 on the mesa portion Mp is etched by, for example, a dry etching process to expose the top surface MpT of the mesa portion Mp, the resin portion 111 in the pair of stripe-shaped grooves 121 and 122 other than the mesa portion Mp is also etched. Ideally, the protective film 107 and the resin portion 111 are preferably etched by the same thickness. It is thus possible to prevent the formation of steps between the top surface MpT and top surfaces 121T and 122T of the resin portion 111 in the stripe-shaped grooves 121 and 122 after the exposure of the top surface MpT of the mesa portion Mp.

However, in fact, when the protective film 107 and the resin portion 111 are etched by, for example, a dry etching process, the etch rate of the protective film 107 is lower than that of the resin portion 111. Thus, the top surfaces 121T and 122T of the resin portion 111 in the stripe-shaped grooves 121 and 122 are more deeply etched. As a result, after the exposure of the top surface MpT of the mesa portion Mp, the top surfaces 121T and 122T of the resin portion 111 in the stripe-shaped grooves 121 and 122 are lower than the top surface MpT. That is, steps Sp are formed between the top surface MpT of the mesa portion Mp and the top surfaces 121T and 122T of the resin portion 111 in the pair of stripe-shaped grooves 121 and 122, the steps Sp having a structure in which the height of the steps Sp is reduced from the top surface MpT of the mesa portion Mp toward the top surfaces 121T and 122T of the resin portion 111 in the pair of stripe-shaped grooves 121 and 122. Accordingly, when an electrical interconnection is formed on the resin portion 111 in the stripe-shaped groove 121, a break of the electrical interconnection is attributed to the steps Sp.

According to an aspect of the present invention, a method for producing an optical semiconductor device includes the steps of (a) forming a semiconductor structure including a stacked semiconductor layer; (b) forming a mask on the semiconductor structure, the mask having a first opening and a second opening, each of the first opening and the second opening extending in a first direction, the first opening and the second opening being separated from each other in a second direction orthogonal to the first direction; (c) etching the semiconductor structure with the mask to form a first stripe-shaped groove, a second stripe-shaped groove, a mesa portion, and external regions on the semiconductor structure, the mesa portion being located between the first stripe-shaped groove and the second stripe-shaped groove, the external regions being located on sides of the first and second stripe-shaped grooves opposite sides on which the mesa portion lies; (d) forming a protective film on a top surface and side surfaces of the mesa portion; (e) forming a resin portion on the protective film, the resin portion covering the mesa portion and the external regions, the first and second stripe-shaped grooves being filled with the resin portion; (f) etching the resin portion and the protective film formed on the top surface of the mesa portion until the top surface of the mesa portion is exposed; (g) forming an upper electrode on the exposed top surface of the mesa portion; and (h) forming an electrical interconnection on the resin portion in the first stripe-shaped groove or the second stripe-shaped groove, the electrical interconnection being electrically connected to the upper electrode. In the step of forming the resin portion, the resin portion has an inclined surface region that rises from a first point above the mesa portion toward a second point above the first stripe-shaped groove in a cross section orthogonal to the first direction. In addition, the step of etching the resin portion and the protective film includes the substeps of etching the resin portion until the inclined surface region comes into contact with the protective film, and simultaneously etching the resin portion and the protective film with an etch rate of the resin portion larger than an etch rate of the protective film.

In the method for producing an optical semiconductor device according to the present invention, in the step of etching the resin portion and the protective film, the resin portion and the protective film are simultaneously etched so as to expose the top surface of the mesa portion by the etching method with the etch rate of the resin portion larger than the etch rate of the protective film.

In the step of forming the resin portion, in a cross section orthogonal to the first direction, the resin portion has the inclined surface region that rises from the first point above the mesa portion toward the second point above the first stripe-shaped groove.

In the substep of simultaneously etching the resin portion and the protective film, after the substep of etching the resin portion until the inclined surface region of the resin portion comes into contact with the protective film, the resin portion and the protective film are simultaneously etched. In the substep of simultaneously etching the resin portion and the protective film, when the protective film above a point in the top surface of the mesa portion directly below a point where the inclined surface region is in contact with the protective film is completely etched, the resin portion is left or is just completely etched above one end point of the top surface of the mesa portion.

In the method for producing an optical semiconductor device according to the present invention, the resin portion formed in the step of forming the resin portion may satisfy the relational expression $\tan\theta \geq 2\, dR/w$ wherein, in a cross section orthogonal to the first direction, $\theta$ represents an interior angle formed by the meeting of the second direction with the inclined surface region, d represents a thickness of the protective film on the top surface of the mesa portion, R represents a ratio of an etch rate of the resin portion to an etch rate of the protective film, and w represents a width of the top surface of the mesa portion in the second direction. In this case, in the cross section orthogonal to the first direction, the height of the inclined surface region of the resin portion immediately after the step of forming the resin portion increases by dR or more when a point shifts by w/2 in the direction of the second direction in which the inclined surface region rises. In the substep of simultaneously etching the resin portion and the protective film, the resin portion is etched by dR while the protective film is etched by the thickness d. Accordingly, when the protective film above the point in the top surface of the mesa portion directly below the point where the inclined surface region is in contact with the protective film is completely etched, the resin portion is left or is just completely etched above one end point of the top surface of the mesa portion (a point a point distant from the point in the top surface of the mesa portion by w/2 in the direction of the second direction).

Thereby, the top surfaces of the resin portion in the stripe-shaped grooves are not lower than the top surface of the mesa portion after the substep of simultaneously etching the resin portion and the protective film. As a result, it is possible to inhibit the formation of steps that are lowered from top surface of the mesa portion toward the resin portion, the steps being located between the top surface of the mesa portion and the top surfaces of the resin portion. Hence, when the electrical interconnection is formed on the resin portion, it is possible to suppress the breaking of the electrical interconnection.

In the method for producing an optical semiconductor device according to the present invention, preferably, in the step of forming the resin portion, the inclined surface region of the resin portion rises from the first point toward a third point above a corresponding one of the external regions through the second point in a cross section orthogonal to the first direction.

In this case, the inclined surface region extends from the first point above the mesa portion to the third point above the corresponding external region. Thus, even if the electrical interconnection is formed so as to extend to the corresponding external region, it is possible to suppress the breaking of the electrical interconnection.

In the method for producing an optical semiconductor device according to the present invention, the protective film is preferably composed of a material that is etched by a reactive ion etching method using a gas mixture of $CF_4$ gas and $O_2$ gas as an etching gas. The etching in the substep of etching the resin portion and the substep of simultaneously etching the resin portion and the protective film is preferably performed by a reactive ion etching method using a gas mixture of $CF_4$ gas and $O_2$ gas as an etching gas. In this case, the resin portion may be composed of a bisbenzocyclobutene resin or a polyimide resin, and the protective film may be composed of a dielectric material. Preferably, the protective film is composed of silicon oxide or silicon nitride.

In this case, in the step of etching the resin portion and the protective film, it is possible to perform the substep of etching the resin portion and the substep of simultaneously etching the resin portion and the protective film by the reactive ion etching method using a gas mixture of $CF_4$ gas and $O_2$ gas as an etching gas. Thus, these substeps may be continuously performed, thereby increasing the production throughput of the optical semiconductor device.

In the method for producing an optical semiconductor device according to the present invention, the protective film is preferably composed of a material that is not substantially etched by a reactive ion etching method using $O_2$ gas as an etching gas. In the substep of etching the resin portion, the resin portion may be selectively etched by a reactive ion etching method using $O_2$ gas as an etching gas until the protective film on the top surface of the mesa portion is exposed. In this case, the resin portion may be composed of a fluorine-containing resin, and the protective film may be composed of a dielectric material. Preferably, the protective film is composed of silicon oxide or silicon nitride.

Accordingly, after the top surface of the protective film is sufficiently exposed without etching the protective film in the substep of etching the resin portion, the substep of simultaneously etching the resin portion and the protective film may be performed. Thus, in the substep of simultaneously etching the resin portion and the protective film, the protective film is more uniformly etched, thereby improving the shape controllability of the mesa portion.

In the method for producing an optical semiconductor device according to the present invention, each of the first and second stripe-shaped grooves preferably has a width larger than a width of the top surface of the mesa portion in the second direction, and letting the width of the top surface of the mesa portion in the second direction be w, letting the width of each of the first and second stripe-shaped grooves in the second direction be z, preferably, a ratio of z to w is 1.5 or more and 6.0 or less.

When the ratio of z to w (z/w) is 1.5 or more, in the step of forming the resin portion, it is possible to easily form the resin portion having the inclined top surface that rises from a position above the mesa portion toward the outside.

When the ratio of z to w (z/w) is 6.0 or less, in the step of forming the resin portion, it is possible to inhibit the formation of the resin portion having the inclined top surface that is lowered from a position above the mesa portion toward the outside. Hence, in the step of forming the resin portion, the resin portion is easily formed, the resin portion having the inclined surface region that rises from the first point above the mesa portion toward the second point above the first stripe-shaped groove in a cross section orthogonal to the first direction.

DESCRIPTION OF THE PREFERRED EMBODIMENTS

Figure 1A:
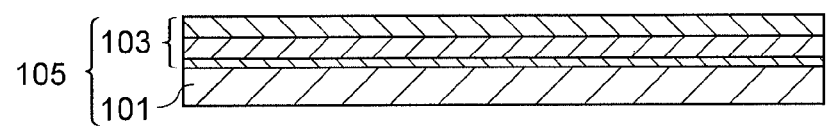
FIGS. 1A to 1C are cross-sectional views illustrating a method for producing an optical semiconductor device in a conventional method.
Figure 1B:
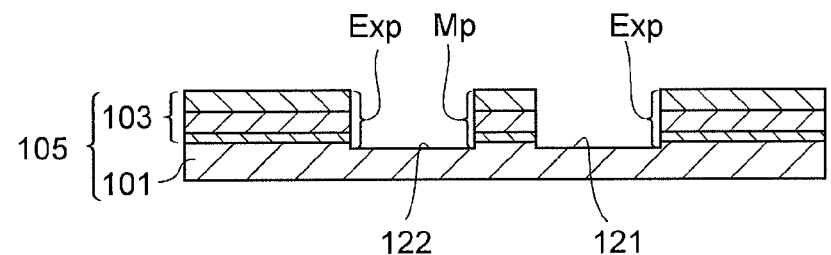
Figure 1C:
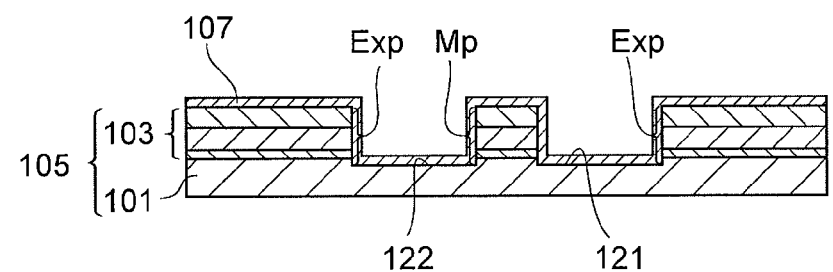
Figure 2A:
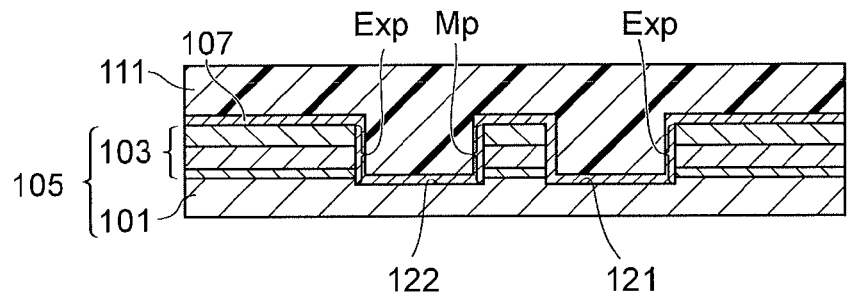
FIGS. 2A to 2C are cross-sectional views illustrating the method for producing an optical semiconductor device in a conventional method.
Figure 2B:
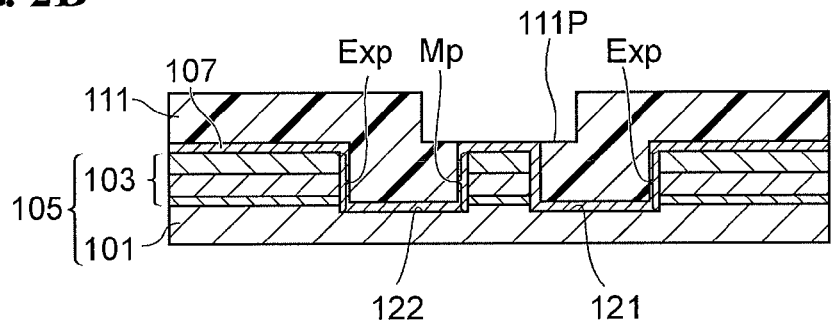
Figure 2C:
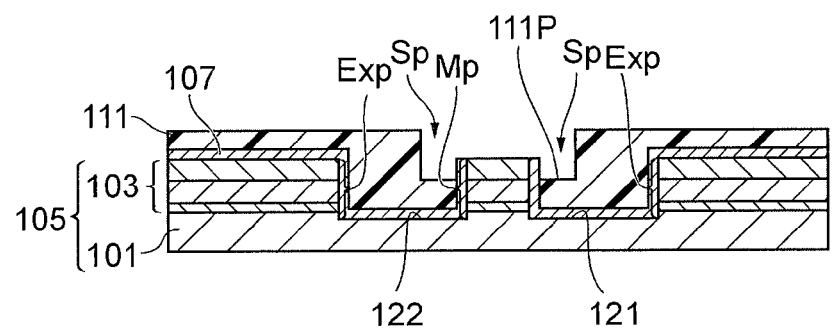

A method for producing an optical semiconductor device according to an embodiment will be described in detail below with reference to the attached drawings. In the drawings, the same elements are designated using the same reference numerals, if possible. Dimensional ratios in an element and between elements are freely set for the sake of visibility.

First Embodiment

A method for producing an optical semiconductor device according to a first embodiment will be described below. The method for producing an optical semiconductor device according to this embodiment is a method for producing a semiconductor laser.

The method for producing an optical semiconductor device according to this embodiment includes a step of forming a semiconductor structure, a mask formation step, a stripe-shaped groove formation step, a protective film formation step, a resin portion formation step, an etching step, an upper electrode formation step, and an electrical interconnection formation step. These steps will be described in detail below.

Semiconductor Structure Formation Step

Figure 3:
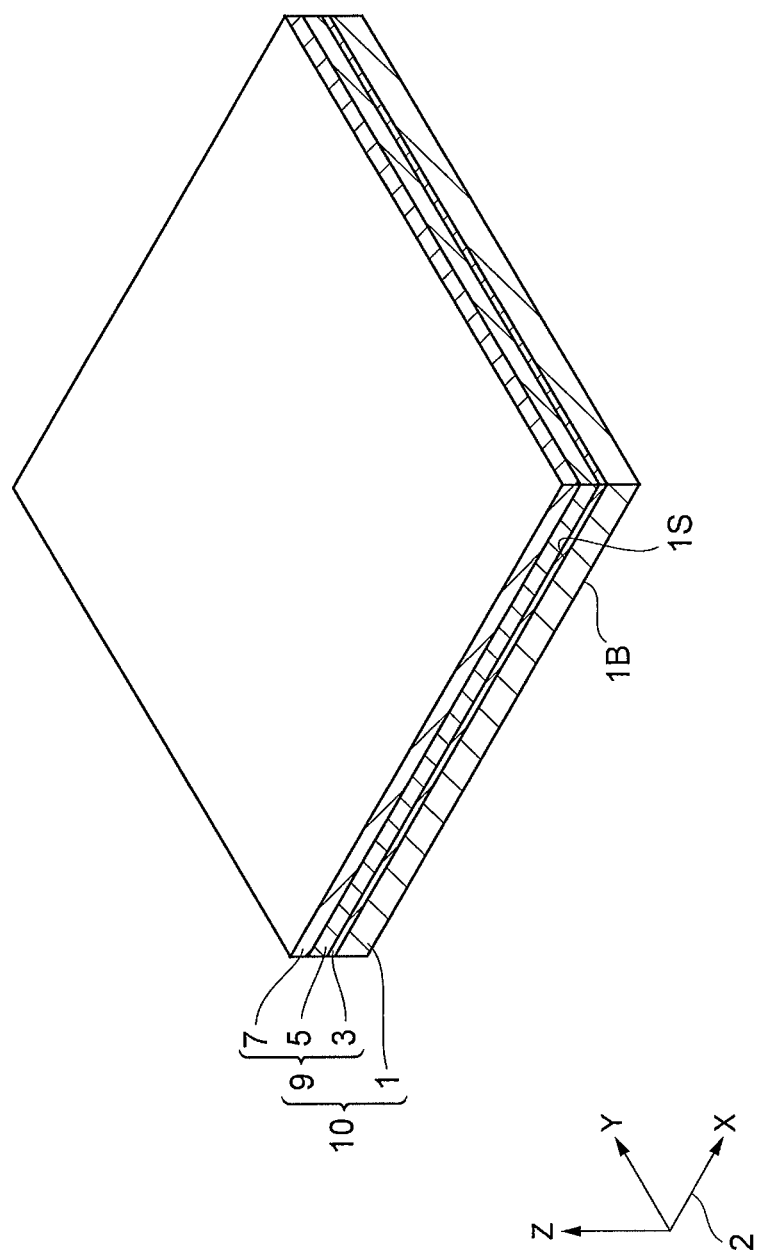
FIG. 3 is a perspective view illustrating a semiconductor structure formation step.

FIG. 3 is a perspective view illustrating the semiconductor structure formation step. In this step, as illustrated in FIG. 3, a semiconductor substrate 1 is prepared. The semiconductor substrate 1 functions as a substrate in this embodiment. A stacked semiconductor layer including an active layer is formed on a main surface 1S of the semiconductor substrate 1. Specifically, in this embodiment, a buffer layer 3, an active layer 5 serving as a core layer, and an upper cladding layer 7 are grown, in that order, on the main surface 1S of the semiconductor substrate 1 by an epitaxial growth method, such as a metal-organic vapor phase epitaxy (MOVPE) method, thereby forming a stacked semiconductor layer 9 including these layers on the main surface 1S. In this way, a semiconductor structure 10 including the semiconductor substrate 1 and the stacked semiconductor layer 9 is formed.

The semiconductor substrate 1 is composed of a semiconductor material having a first conductivity type (for example, n-type). For example, the semiconductor substrate 1 is composed of a III-V group compound semiconductor, such as InP. The semiconductor substrate 1 includes the substantially flat main surface 1S and a substantially flat back surface 1B opposite the main surface 1S. In FIG. 3 and the subsequent figures, a rectangular coordinate system 2 is illustrated. The X-axis and the Y-axis of the rectangular coordinate system 2 lie in directions parallel to the main surface 1S, and the Z-axis of the rectangular coordinate system 2 lies in the direction orthogonal to the main surface 1S (in other words, in the thickness direction of the semiconductor substrate 1 and in the stacking direction of the stacked semiconductor layer 9).

The buffer layer 3 is composed of, for example, a semiconductor material having a first conductivity type (for example, n-type). For example, the buffer layer 3 is composed of a III-V group compound semiconductor, such as InP. The semiconductor substrate 1 and the buffer layer 3 function as a lower cladding for the active layer 5. The active layer 5 has, for example, a multi quantum well (MQW) structure or a single quantum well (SQW) structure. The active layer 5 is composed of a III-V group compound semiconductor, such as undoped GaInAsP or undoped AlGaInAs. The upper cladding layer 7 is composed of a semiconductor material of a second conductivity type (p-type when the first conductivity type is an n-type). For example, the upper cladding layer 7 is composed of a III-V group compound semiconductor, such as InP.

Mask Formation Step

Figure 4:
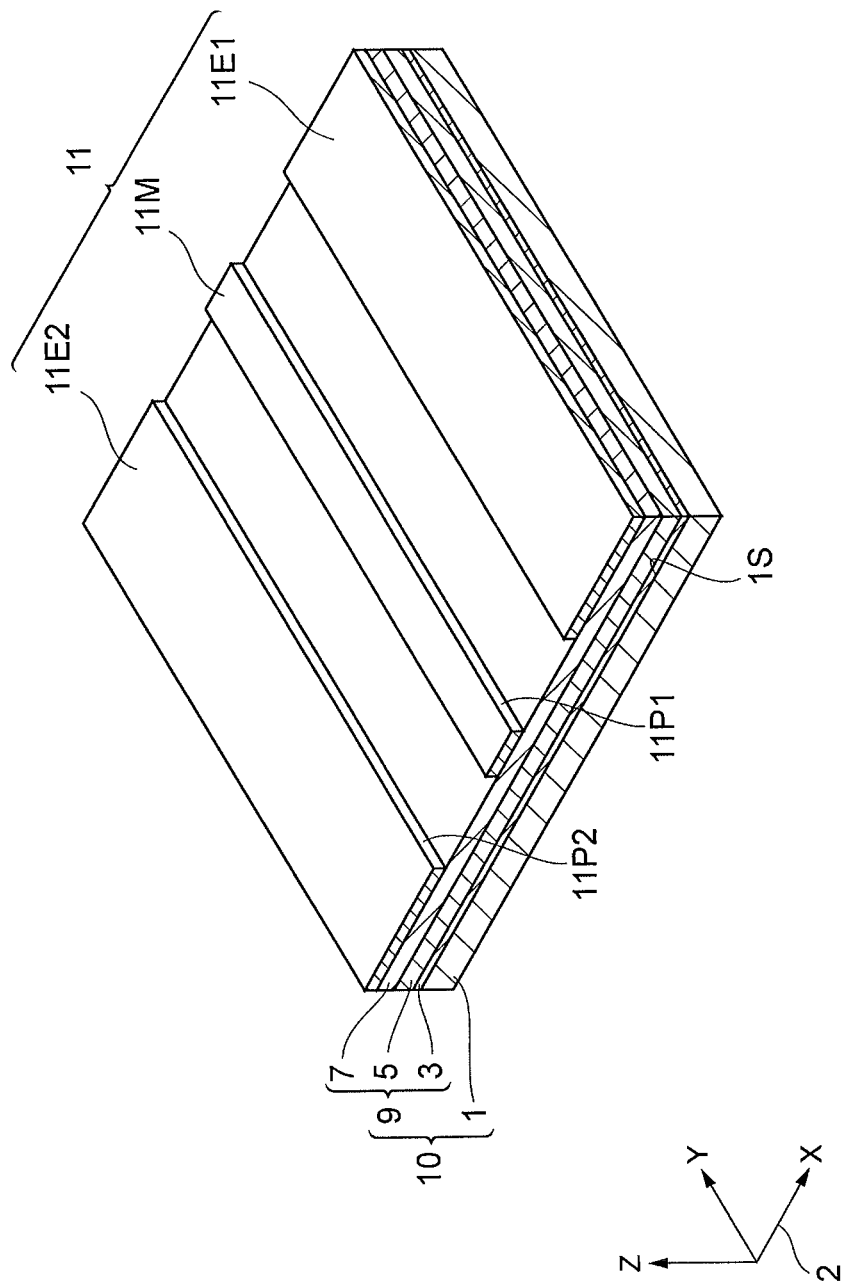
FIG. 4 is a perspective view illustrating a mask formation step.

Next, a mask formation step is performed. FIG. 4 is a perspective view illustrating the mask formation step. In this step, as illustrated in FIG. 4, a mask 11 is formed on the upper cladding layer 7 of the stacked semiconductor layer 9. The mask 11 is composed of a dielectric material, for example, silicon dioxide ($SiO_2$) or silicon nitride (SiN).

The mask 11 has a first opening 11P1, a second opening 11P2, a central mask region 11M, a first external mask region 11E1, and a second external mask region 11E2. Each of the first opening 11P1 and the second opening 11P2 extends in the Y-axis direction, which is a first direction. The first opening 11P1 and the second opening 11P2 are separated from each other in the X-axis direction, which is a second direction.

Each of the central mask region 11M, the first external mask region 11E1, and the second external mask region 11E2 extends in the Y-axis direction, which is the first direction. The first external mask region 11E1, the central mask region 11M, and the second external mask region 11E2 are arranged, in that order, and separated from each other in the X-axis direction. The central mask region 11M and the first external mask region 11E1 define the first opening 11P1. The central mask region 11M and the second external mask region 11E2 define the second opening 11P2.

Figure 5:
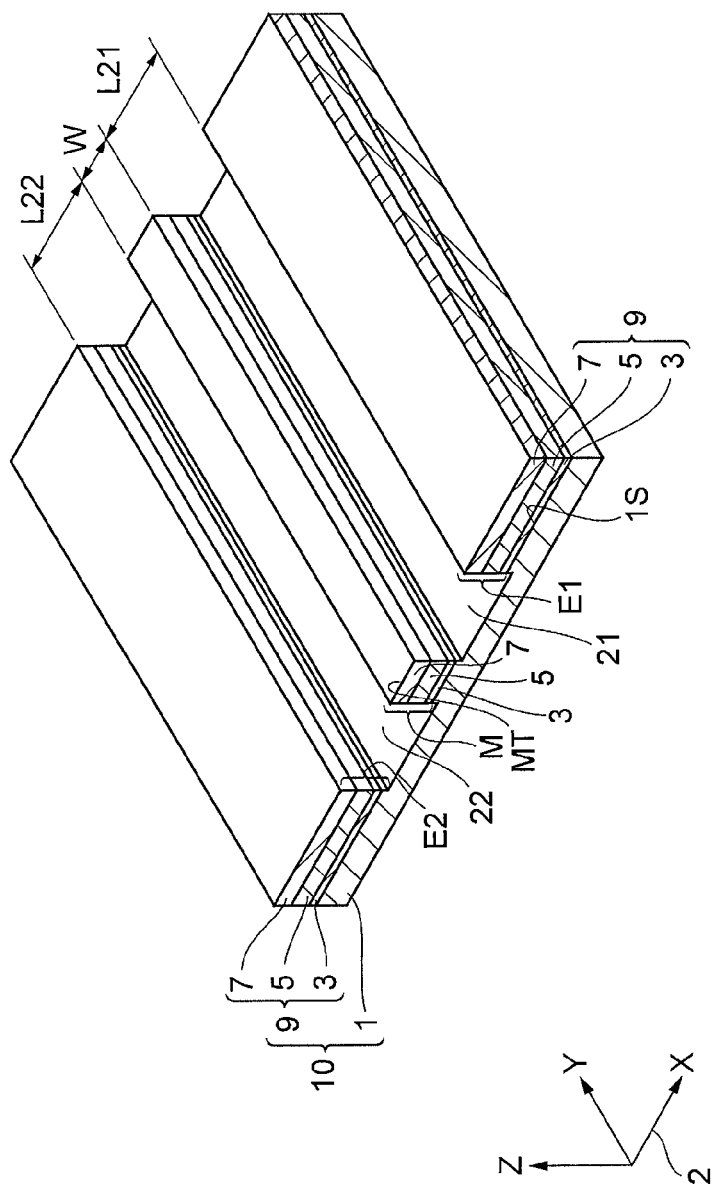
FIG. 5 is a perspective view illustrating a stripe-shaped groove formation step.

The central mask region 11M corresponds to a region of the semiconductor structure 10 to be formed into a mesa portion M (see FIG. 5). The first external mask region 11E1 corresponds to a region of the semiconductor structure 10 to be formed into a first external region E1 (see FIG. 5). The second external mask region 11E2 corresponds to a region of the semiconductor structure 10 to be formed into a second external region E2 (see FIG. 5). The first opening 11P1 corresponds to a region of the semiconductor structure 10 to be formed into a first stripe-shaped groove 21 (see FIG. 5). The second opening 11P2 corresponds to a region of the semiconductor structure 10 to be formed into a second stripe-shaped groove 22 (see FIG. 5).

To form the mask 11, a layer composed of a dielectric material, for example, $SiO_2$ or SiN, is formed on the entire upper surface of the semiconductor structure 10 by a chemical vapor deposition (CVD) method. The layer composed of the dielectric material is patterned into a predetermined shape by photolithography. The mask 11 is formed through such a procedure.

Stripe-Shaped Groove Formation Step

Subsequently, the stripe-shaped groove formation step is performed. FIG. 5 is a perspective view illustrating the stripe-shaped groove formation step. In this step, as illustrated in FIG. 5, the semiconductor structure 10 is etched by, for example, a dry etching process with the mask 11 by a predetermined depth (in this embodiment, a depth that reaches an intermediate position in the thickness direction of the semiconductor substrate 1). An example of the dry etching process that may be employed is an inductive coupled plasma reactive ion etching (ICP-RIE) method with hydrogen iodide (HI) gas as an etching gas. The mask 11 is then removed by, for example, a wet etching technique with hydrofluoric acid or the like as an etching solution.

Thereby, a pair of stripe-shaped grooves, i.e., the first stripe-shaped groove 21 and the second stripe-shaped groove 22, is formed in the semiconductor structure 10. The first stripe-shaped groove 21 and the second stripe-shaped groove 22 have depths in the Z-axis direction, extend in the Y-axis direction, and are separated from each other in the X-axis direction. In this embodiment, each of the first stripe-shaped groove 21 and the second stripe-shaped groove 22 has a substantially rectangular cross-section parallel to the XZ plane.

The first stripe-shaped groove 21 and the second stripe-shaped groove 22 define the mesa portion M located between the first stripe-shaped groove 21 and the second stripe-shaped groove 22. The first stripe-shaped groove 21 defines the first external region E1 located on a side of the first stripe-shaped groove 21 opposite the side adjacent to the mesa portion M (in the positive direction of the X-axis). The second stripe-shaped groove 22 defines the second external region E2 located on a side of the second stripe-shaped groove 22 opposite to the side adjacent to the mesa portion M (in the negative direction of the X-axis). The width L21 of the first stripe-shaped groove 21 in the X-axis direction is, for example, 1.5 µm or more and 6 µm or less. The width L22 of the second stripe-shaped groove 22 in the X-axis direction is, for example, 1.5 µm or more and 6 µm or less.

The mesa portion M protrudes in the Z-axis direction and extends in the Y-axis direction. The mesa portion M constitutes a waveguide including the active layer 5, a portion functioning as a lower cladding (in this embodiment, the buffer layer 3 and the semiconductor substrate 1), and a portion functioning as an upper cladding (in this embodiment, the upper cladding layer 7). The optical axis of the waveguide lies in the Y-axis direction in which the mesa portion M extends. That is, the mesa portion M has the function of propagating light in the Y-axis direction. In this embodiment, a cross-sectional shape of the mesa portion M parallel to the XZ plane is a substantially rectangular shape formed of a substantially linear cross-sectional profile of the top surface MT extending in the X-axis direction and substantially linear cross-sectional profiles of side surfaces of the mesa portion M extending in the Z-axis direction. The cross-sectional shape may be a trapezoidal shape or an inverted trapezoidal shape including a substantially linear cross-sectional profile of the top surface MT extending in the X-axis direction. In this embodiment, the top surface MT of the mesa portion M is a substantially flat surface substantially parallel to the XY plane.

The height of the mesa portion M in the Z-axis direction (that is, the depth of the first stripe-shaped groove 21 and the second stripe-shaped groove 22 in the Z-axis direction) is, for example, 3 µm or more and 4 µm or less. The width w of the mesa portion M in the X-axis direction is, for example, 1 µm or more and 2.5 µm or less.

In this embodiment, each of the first external region E1 and the second external region E2 has a substantially flat top surface substantially parallel to the XY plane.

Protective Film Formation Step

Figure 6:
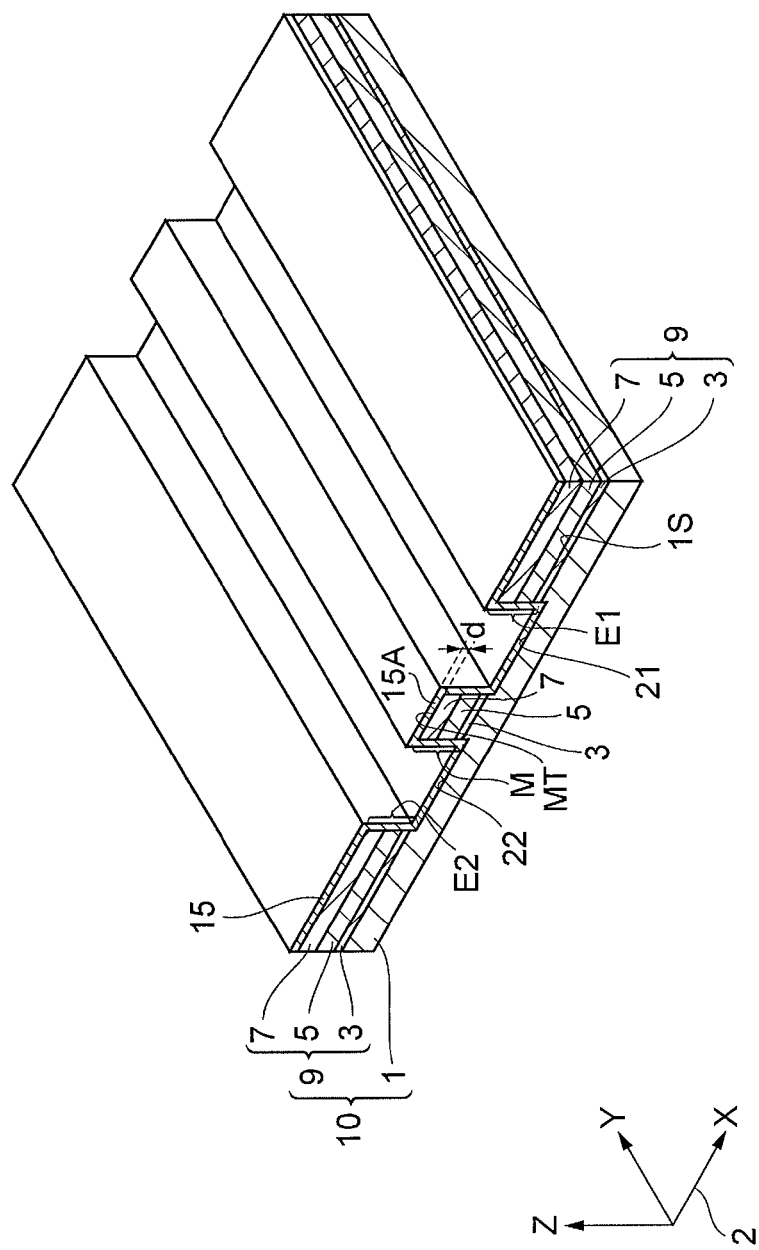
FIG. 6 is a perspective view illustrating a protective film formation step.

Next, the protective film formation step is performed. FIG. 6 is a perspective view illustrating the protective film formation step. In this step, as illustrated in FIG. 6, a protective film 15 is formed on the exposed surface of the semiconductor structure 10. Specifically, in this embodiment, the protective film 15 is formed by, for example, a chemical vapor deposition (CVD) method on the top surface MT of the mesa portion M, one side surface of the mesa portion M (one side surface of the first stripe-shaped groove 21), the bottom surface of the first stripe-shaped groove 21, the other side surface of the first stripe-shaped groove 21 (a side surface of the first external region E1), the top surface of the first external region E1, the other side surface of the mesa portion M (one side surface of the second stripe-shaped groove 22), the bottom surface of the second stripe-shaped groove 22, the other side surface of the second stripe-shaped groove 22 (a side surface of the second external region E2), and the top surface of the second external region E2. As illustrated in FIG. 6, the protective film 15 preferably has a shape that conforms to the top surfaces, the side surfaces, and the bottom surfaces.

The protective film 15 is formed of a dielectric material, for example, silicon dioxide ($SiO_2$) or silicon nitride (SiN). The thickness of the protective film 15 is smaller than the height of the first stripe-shaped groove 21 in the Z-axis direction and the height of the second stripe-shaped groove 22 in the Z-axis direction. Furthermore, the thickness of the protective film 15 is smaller than the width L21 of the first stripe-shaped groove 21 in the X-axis direction and the width L22 of the second stripe-shaped groove 22 in the X-axis direction. The protective film 15 is formed in part of a region in the first stripe-shaped groove 21. Furthermore, the protective film 15 is formed in part of a region in the second stripe-shaped groove 22. A region 15A of the protective film 15 on the top surface MT of the mesa portion M has a thickness in the Z-axis direction of for example, 0.1 μm or more and 0.3 μm or less.

Resin Portion Formation Step

Figure 7:
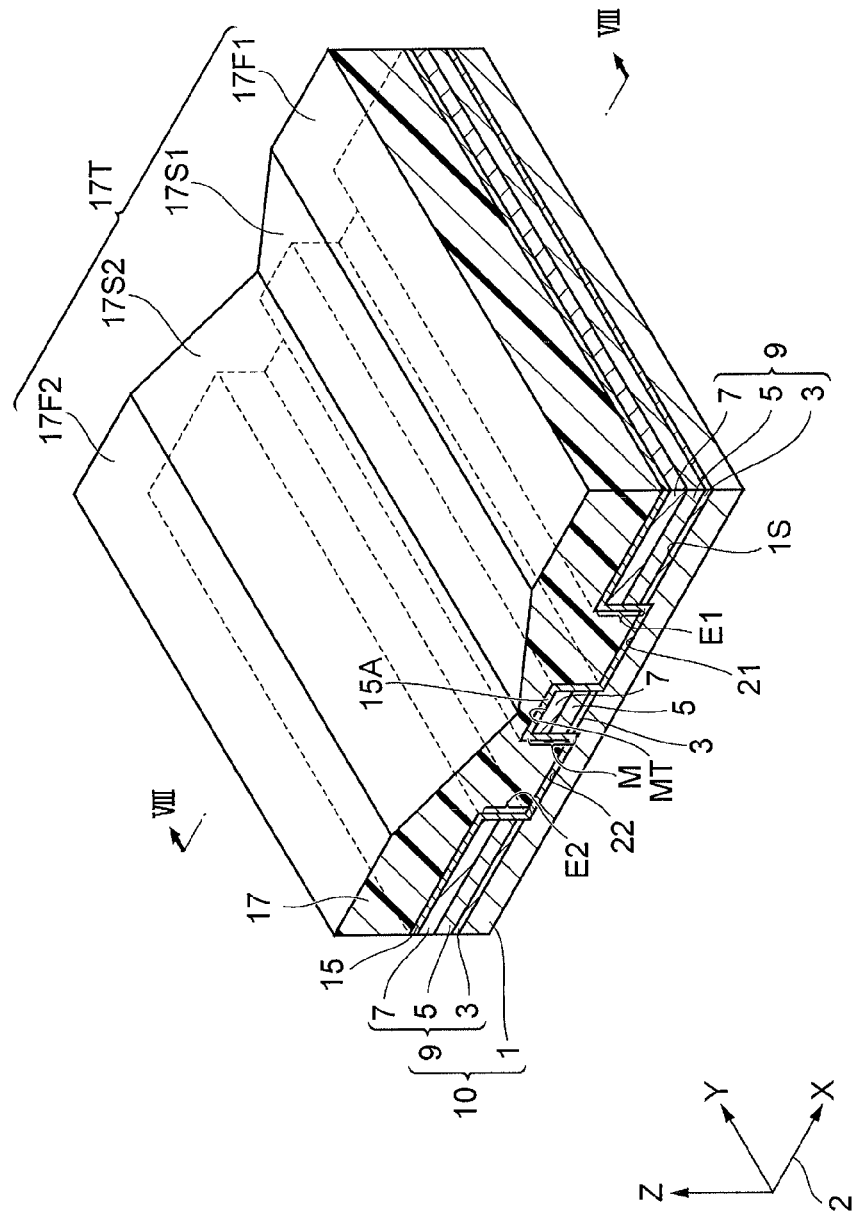
FIG. 7 is a perspective view illustrating a resin portion formation step.
Figure 8:
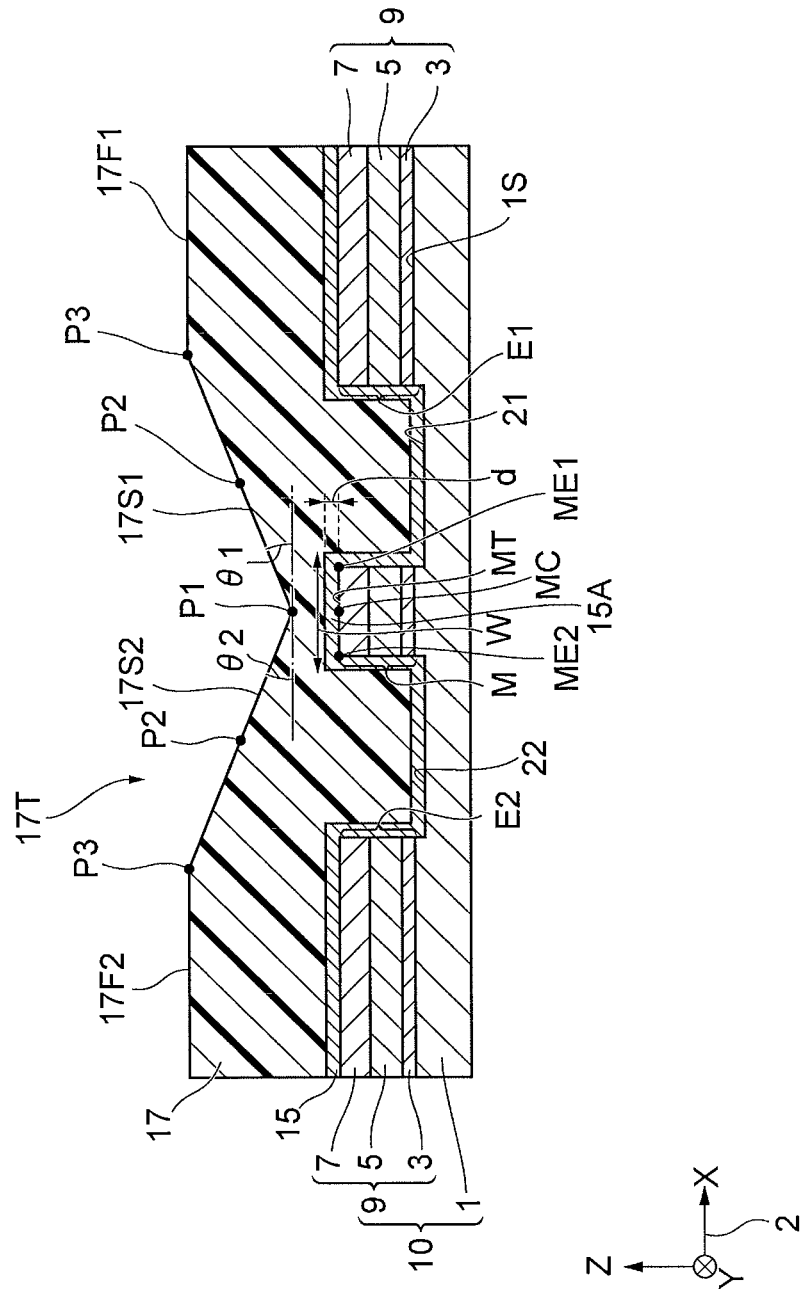
FIG. 8 is a cross-sectional view taken along line VIII-VIII in FIG. 7.

Subsequently, the resin portion formation step is performed. FIG. 7 is a perspective view illustrating the resin portion formation step. FIG. 8 is a cross-sectional view taken along line VIII-VIII in FIG. 7 (a cross-sectional view in a plane orthogonal to the Y-axis).

In this step, as illustrated in FIGS. 7 and 8, a resin portion 17 is formed on the semiconductor structure 10. To form the resin portion 17, a resin is applied on the semiconductor structure 10 by a method, such as spin coating. The resin is then cured, as needed, thereby forming the resin portion 17. The resin portion 17 is composed of a resin, for example, a bisbenzocyclobutene (BCB) resin, a polyimide resin, or a fluorine-containing resin.

As illustrated in FIGS. 7 and 8, the resin portion 17 is formed so as to cover the mesa portion M, the first external region E1, and the second external region E2. Furthermore, the resin portion 17 is formed on the semiconductor substrate 1 and the side surfaces of the mesa portion M so as to fill the first stripe-shaped groove 21 and the second stripe-shaped groove 22 with the resin portion 17. A top surface 17T of the resin portion 17 includes a first inclined surface region 17S1, a first external surface region 17F1, a second inclined surface region 17S2, and a second external surface region 17F2 in a cross section orthogonal to the Y-axis.

As illustrated in FIG. 8, the first inclined surface region 17S1 according to this embodiment is a substantially flat surface region. A cross section of the first inclined surface region 17S1 orthogonal to the Y-axis forms an interior angle of θ1 to the X-axis direction. The interior angle θ1 is an acute angle. Specifically, the first inclined surface region 17S1 rises from a first point P1 above the mesa portion M toward a second point P2 above the first stripe-shaped groove 21. In other words, a distance between the main surface 1S of the semiconductor substrate 1 before the formation of the first stripe-shaped groove 21 and the first inclined surface region 17S1 in the Z-axis direction increases from the first point P1 toward the second point P2. The first inclined surface region 17S1 rises from the second point P2 toward a third point P3 above the first external region E1. In other words, a distance between the main surface 1S of the semiconductor substrate 1 before the formation of the first stripe-shaped groove 21 and the first inclined surface region 17S1 in the Z-axis direction increases from the second point P2 toward the third point P3.

Similarly, as illustrated in FIG. 8, the second inclined surface region 17S2 according to this embodiment is a substantially flat surface region. A cross section of the second inclined surface region 17S2 orthogonal to the Y-axis forms an interior angle of θ2 to the X-axis direction. The interior angle θ2 is an acute angle. Specifically, the second inclined surface region 17S2 rises from the first point P1 above the mesa portion M toward a second point P2 above the second stripe-shaped groove 22. In other words, a distance between the main surface 1S of the semiconductor substrate 1 before the formation of the second stripe-shaped groove 22 and the second inclined surface region 17S2 in the Z-axis direction increases from the first point P1 toward the second point P2. The second inclined surface region 17S2 rises from the second point P2 toward a third point P3 above the second external region E2. In other words, a distance between the main surface 1S of the semiconductor substrate 1 before the formation of the second stripe-shaped groove 22 and the second inclined surface region 17S2 in the Z-axis direction increases from the second point P2 toward the third point P3.

According to this embodiment, in a cross section orthogonal to the Y-axis, the first point P1 is located directly above a midpoint MC of the top surface MT of the mesa portion M in the X-axis direction. However, in a cross section orthogonal to the Y-axis, the first point P1 may be located above the top surface MT of the mesa portion M. In other words, in a cross section orthogonal to the Y-axis, the first point P1 may be located directly above any point of the top surface MT of the mesa portion M between one end point ME1 and the other end point ME2.

Letting a value of the interior angle θ1 (or interior angle θ2) be θ, letting the thickness of the region 15A of the protective film 15 on the top surface MT of the mesa portion M be d, letting the width of the top surface MT of the mesa portion M in the axis direction be w, and letting a value of an etch rate ratio R described below (see descriptions of FIGS. 11 and 12) be R, the relational expression $\tan \theta \geq 2 dR/w$ is satisfied. That is, the lower limit of the value θ of the interior angle θ1 (or the interior angle θ2) is arctan (2 dR/w). The lower limit of the value of the interior angle θ1 (or the interior angle θ2), i.e., arctan (2 dR/w), is, for example, about 4.5° or more and about 30° or less. For example, when the thickness d of the region 15A of the protective film 15 is 0.2 μm, the width w of the top surface MT of the mesa portion M is 1.5 μm, and the etch rate ratio R is 1.5, arctan (2 dR/w), which represents the lower limit of the value of the interior angle θ1 (or the interior angle θ2), is 21.8°.

Each of the interior angles θ1 and θ2 is an acute angle and thus is less than 90°. In particular, each of the interior angles θ1 and θ2 is preferably 45° or less and more preferably 30° or less.

In a cross section orthogonal to the Y-axis, the interior angle θ1 and the interior angle θ2, which are angles formed by the first inclined surface region 17S1 and the second inclined surface region 17S2 with the X-axis direction, may be controlled by appropriately adjusting the number of rotations of the semiconductor structure 10, the viscosity of the resin, the width L21 of the first stripe-shaped groove 21, the width L22 of the second stripe-shaped groove 22, and the width w of the mesa portion M when a resin to be formed into the resin portion 17 is spin-coated on the semiconductor structure 10.

In this embodiment, the first inclined surface region 17S1 and the second inclined surface region 17S2 are substantially flat. However, they may not be flat. When the first inclined surface region 17S1 and/or the second inclined surface region 17S2 is not flat, in a cross section orthogonal to the Y-axis, the interior angle θ1 and/or the interior angle θ2 may be defined by an angle formed by the meeting of a straight line obtained by a straight-line approximation of the first inclined surface region 17S1 and/or the second inclined surface region 17S2 with the X-axis direction. The same is true for a first inclined surface region 17S1a, a second inclined surface region 17S2a, and so forth (see FIG. 10).

The first external surface region 17F1 is located above the first external region E1. In this embodiment, the first external surface region 17F1 extends in a direction parallel to the XY plane. Similarly, the second external surface region 17F2 is located above the second external region E2. In this embodiment, the second external surface region 17F2 extends in a direction parallel to the XY plane.

Etching Step

Subsequently, the etching step is performed. The etching step includes a resin portion etching substep and a simultaneous etching substep.

Resin Portion Etching Substep

Figure 9:
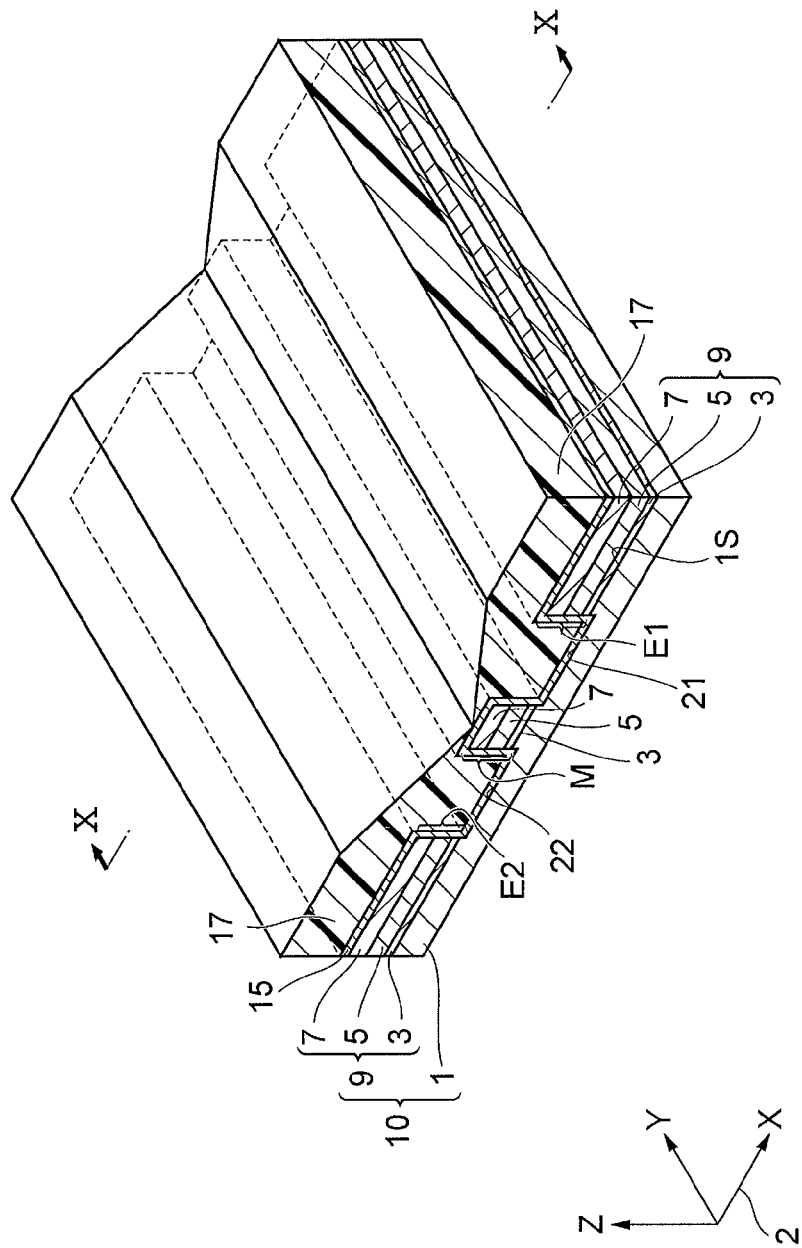
FIG. 9 is a perspective view illustrating a resin portion etching substep.
Figure 10:
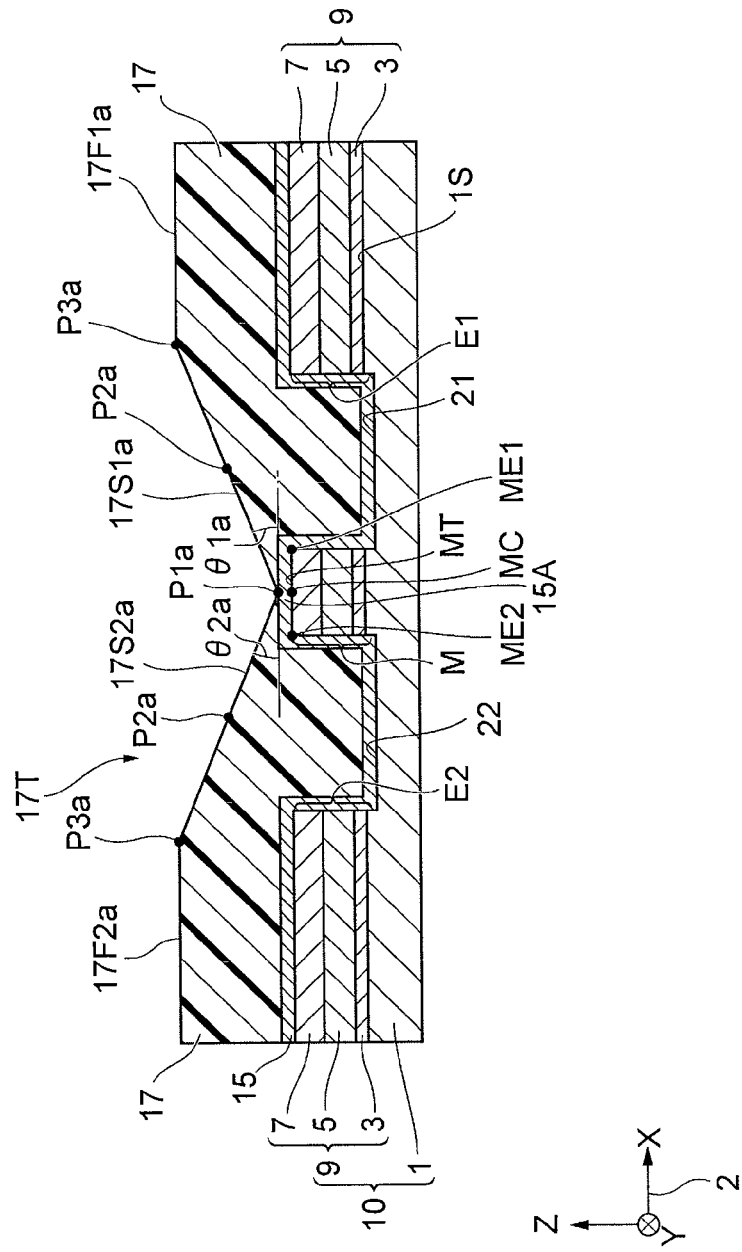
FIG. 10 is a cross-sectional view taken along line X-X in FIG. 9.

FIG. 9 is a perspective view illustrating the resin portion etching substep. FIG. 10 is a cross-sectional view taken along line X-X in FIG. 9 (a cross-sectional view in a plane orthogonal to the Y-axis). FIGS. 9 and 10 illustrate a state immediately after the completion of the resin portion etching substep in this embodiment.

In the resin portion etching substep, as illustrated in FIGS. 9 and 10, the top surface 17T of the resin portion 17 is etched to lower the first inclined surface region 17S1, the second inclined surface region 17S2, the first external surface region 17F1, and the second external surface region 17F2 (see FIG. 8) in the negative direction of the Z-axis. In other words, the positions of the first inclined surface region 17S1, the second inclined surface region 17S2, the first external surface region 17F1, and the second external surface region 17F2 are brought close to the semiconductor substrate 1. The first inclined surface region 17S1a illustrated in FIG. 10 is the first inclined surface region 17S1 that has been lowered in the Z-axis direction (see FIG. 8). The second inclined surface region 17S2a is the second inclined surface region 17S2 that has been lowered in the Z-axis direction (see FIG. 8). A first external surface region 17F1a is the first external surface region 17F1 that has been lowered in the Z-axis direction (see FIG. 8). A second external surface region 17F2a is the second external surface region 17F2 that has been lowered in the Z-axis direction (see FIG. 8). A first point P1a is the first point P1 that has been lowered in the Z-axis direction (see FIG. 8). Second points P2a are the second points P2 that have been lowered in the Z-axis direction (see FIG. 8). Third points P3a are the third points P3 that have been lowered in the Z-axis direction (see FIG. 8).

The etching of the resin portion 17 in this substep is preferably performed by a dry etching process, such as a reactive ion etching (RIE) method. In this embodiment, a reactive ion etching method using a gas mixture of $CF_4$ gas and $O_2$ gas as an etching gas is employed.

The etching of the resin portion 17 in this substep is performed in such a manner that the first inclined surface region 17S1a and the second inclined surface region 17S2a come into contact with the region 15A of the protective film 15 after the etching. In this embodiment, the etching of the resin portion 17 in this substep is performed until the first point P1a of the first inclined surface region 17S1a and the second inclined surface region 17S2a comes into contact with the region 15A of the protective film 15.

As illustrated in FIG. 10, in this embodiment, the first inclined surface region 17S1a immediately after the resin portion etching substep is substantially flat. In a cross section orthogonal to the Y-axis, the first inclined surface region 17S1a forms an interior angle θ1a to the X-axis direction. The interior angle θ1a is an acute angle. In this embodiment, the interior angle θ1a is substantially equal to the interior angle θ1 (see FIG. 8) formed by the meeting of the first inclined surface region 17S1 immediately after the resin portion formation step with the X-axis direction.

Similarly, in this embodiment, the second inclined surface region 17S2a immediately after the resin portion etching substep is substantially flat. In a cross section orthogonal to the Y-axis, the second inclined surface region 17S2a forms an interior angle θ2a to the X-axis direction. The interior angle θ2a is an acute angle. In this embodiment, the interior angle θ2a is substantially equal to the interior angle θ2 (see FIG. 8) formed by the meeting of the second inclined surface region 17S2 immediately after the resin portion formation step with the X-axis direction.

In this embodiment, the first external surface region 17F1a extends in a direction parallel to the XY plane. In this embodiment, the second external surface region 17F2a extends in a direction parallel to the XY plane.

Simultaneous Etching Substep

Figure 11:
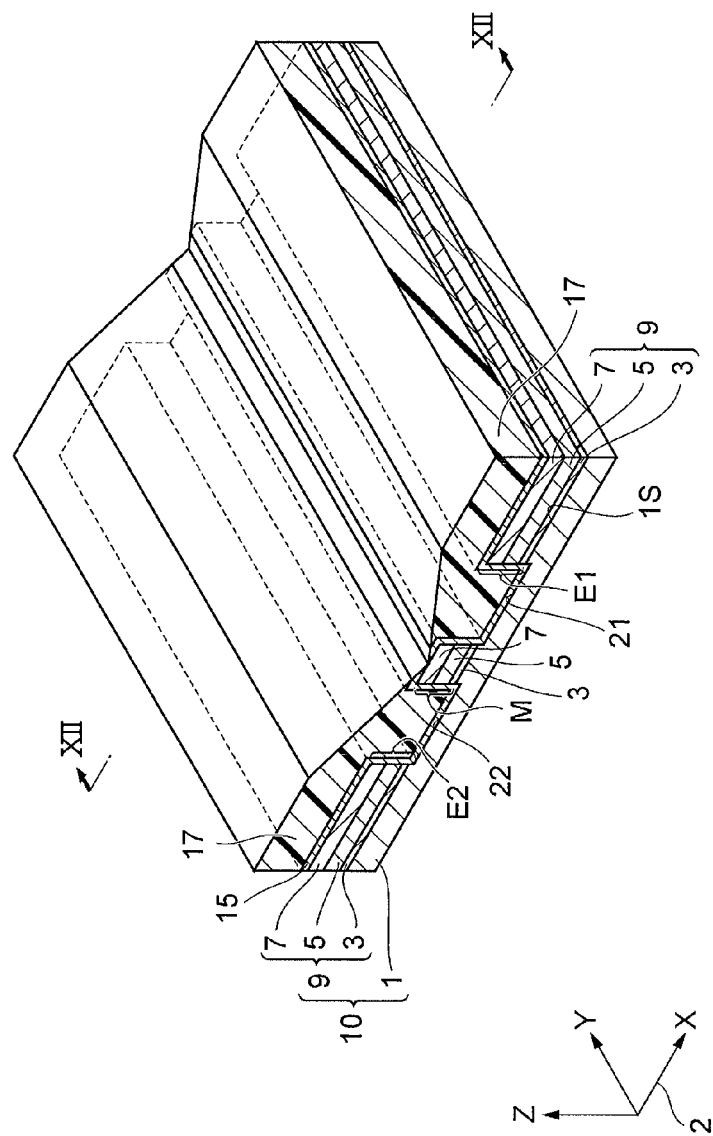
FIG. 11 is a perspective view illustrating a simultaneous etching substep.
Figure 12:
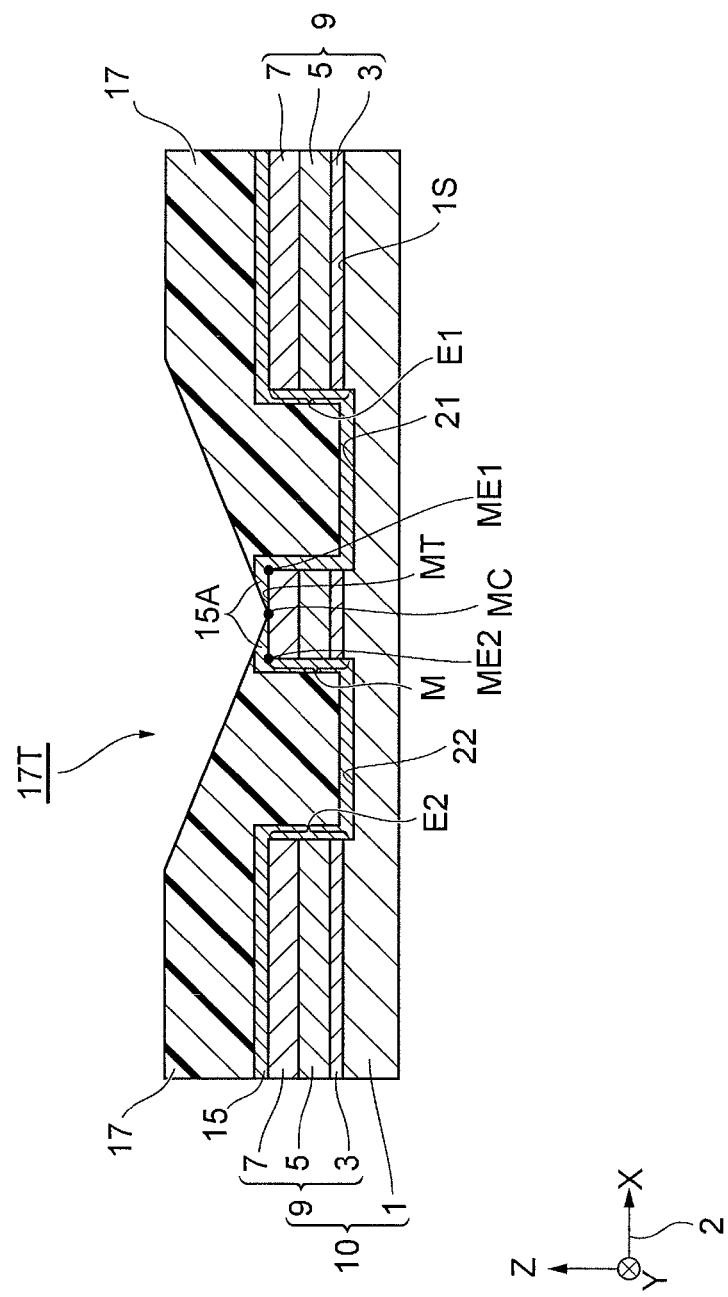
FIG. 12 is a cross-sectional view taken along line XII-XII in FIG. 11.
Figure 13:
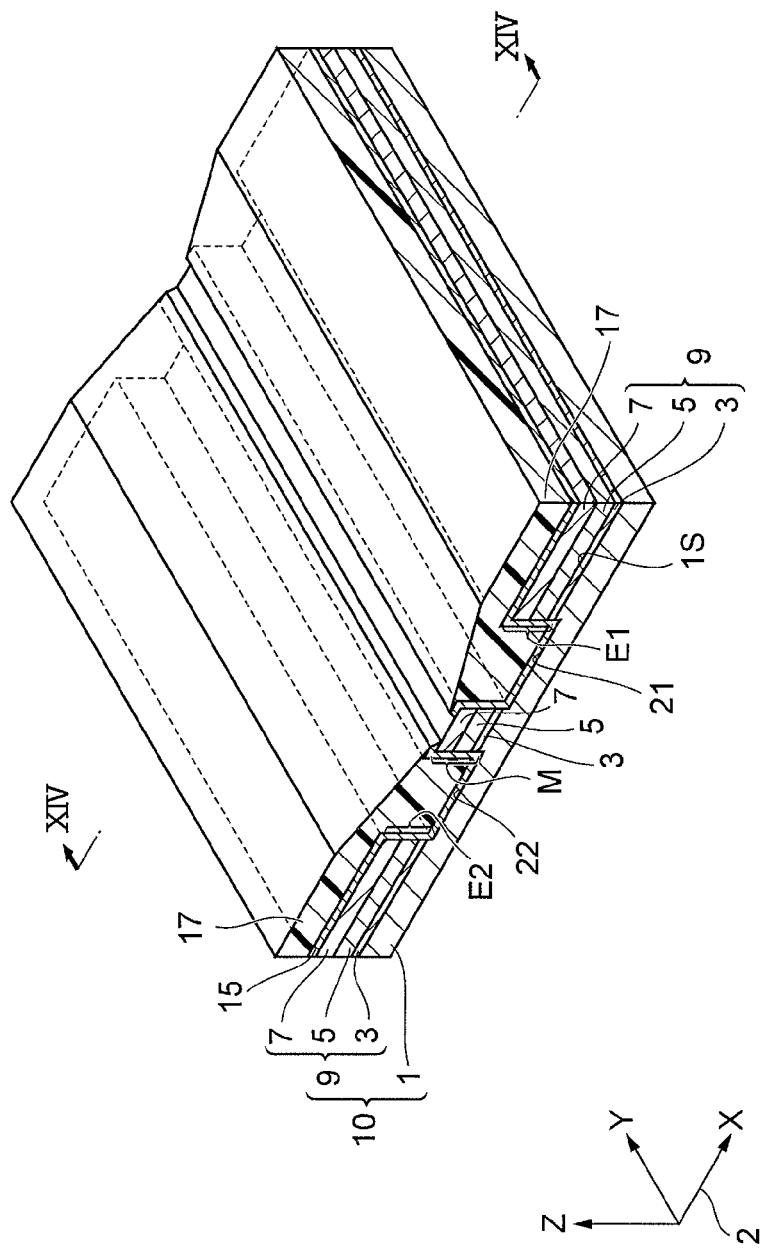
FIG. 13 is a perspective view illustrating a simultaneous etching substep.
Figure 14:
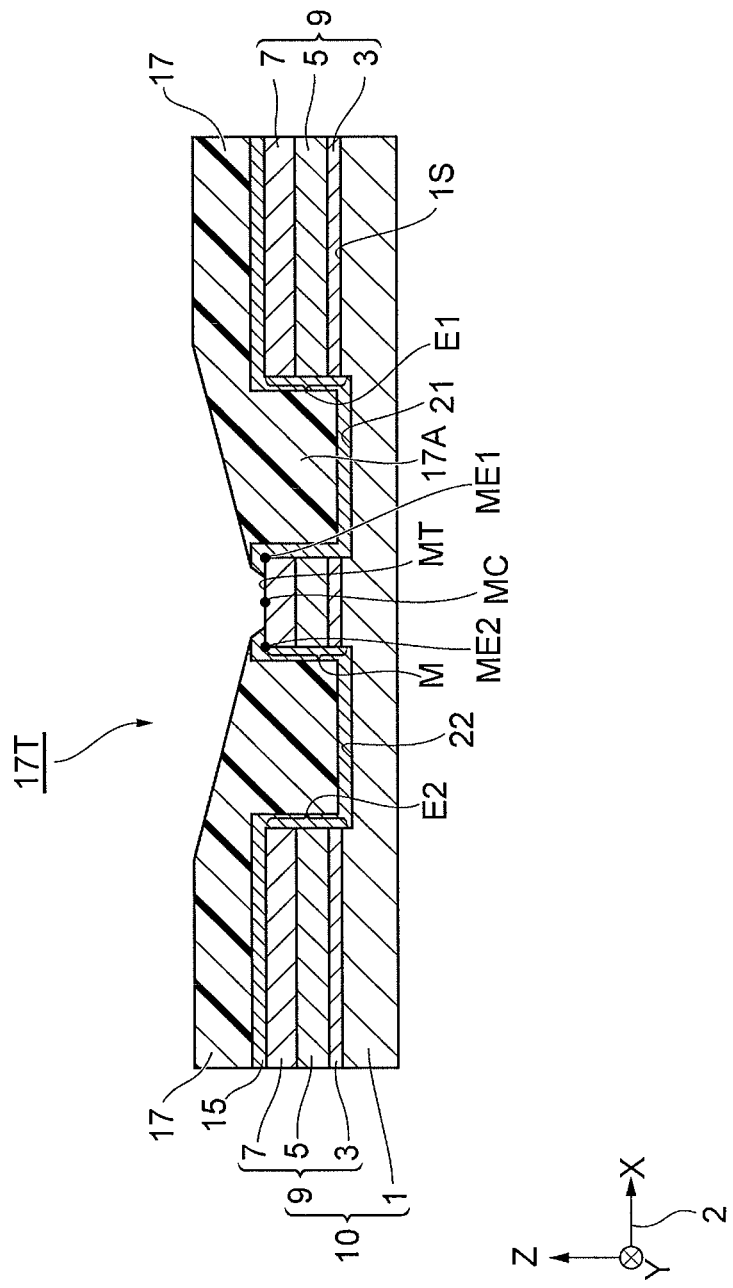
FIG. 14 is a cross-sectional view taken along line XIV-XIV in FIG. 13.

Subsequently, the simultaneous etching substep is performed. FIGS. 11 and 13 are perspective views illustrating the simultaneous etching substep. FIG. 12 is a cross-sectional view taken along lien XII-XII in FIG. 11 (a cross-sectional view in a plane orthogonal to the Y-axis). FIG. 14 is a cross-sectional view taken along line XIV-XIV in FIG. 13 (a cross-sectional view in a plane orthogonal to the Y-axis). FIGS. 11 and 12 illustrate a state in the middle of the simultaneous etching substep. FIGS. 13 and 14 illustrate a state immediately after the completion of the simultaneous etching substep.

In this substep, letting the etch rate of the protective film 15 be $r_1$, letting the etch rate of the resin portion 17 be $r_2$, and letting the etch rate ratio R be $r_2/r_1$, the resin portion 17 and the protective film 15 are simultaneously etched by an etching method that satisfies the relational expression R>1. In other words, the resin portion 17 and the protective film 15 are simultaneously etched by an etching method such that the etch rate $r_2$ of the resin portion 17 is larger than the etch rate $r_1$ of the protective film 15.

As such an etching method, a dry etching process, such as a reactive ion etching method, may be employed. In this embodiment, a reactive ion etching method using a gas mixture of $CF_4$ gas and $O_2$ gas as an etching gas is employed.

When the etching described above is performed, as illustrated in FIGS. 11 and 12, a portion of the region 15A of the protective film 15 directly below the first point P1a (see FIG. 10) is etched. Thereby, part of the top surface MT of the mesa portion M (in this embodiment, the midpoint MC of the top surface MT) is exposed, and the top surface 17T of the resin portion 17 is lowered in the negative direction of the Z-axis.

When the etching described above is further performed, as illustrated in FIGS. 13 and 14, the region 15A of the protective film 15 is further etched. Thereby, a wider area of the top surface MT of the mesa portion M is exposed, and the top surface 17T of the resin portion 17 is further lowered in the negative direction of the Z-axis.

In this way, in the etching step, part of the resin portion 17 and the region 15A of the protective film 15 on the top surface MT of the mesa portion M are etched so as to expose the top surface MT of the mesa portion M. Then, an opening is formed on the top surface MT of the mesa portion M.

Upper Electrode Formation Step

Figure 15:
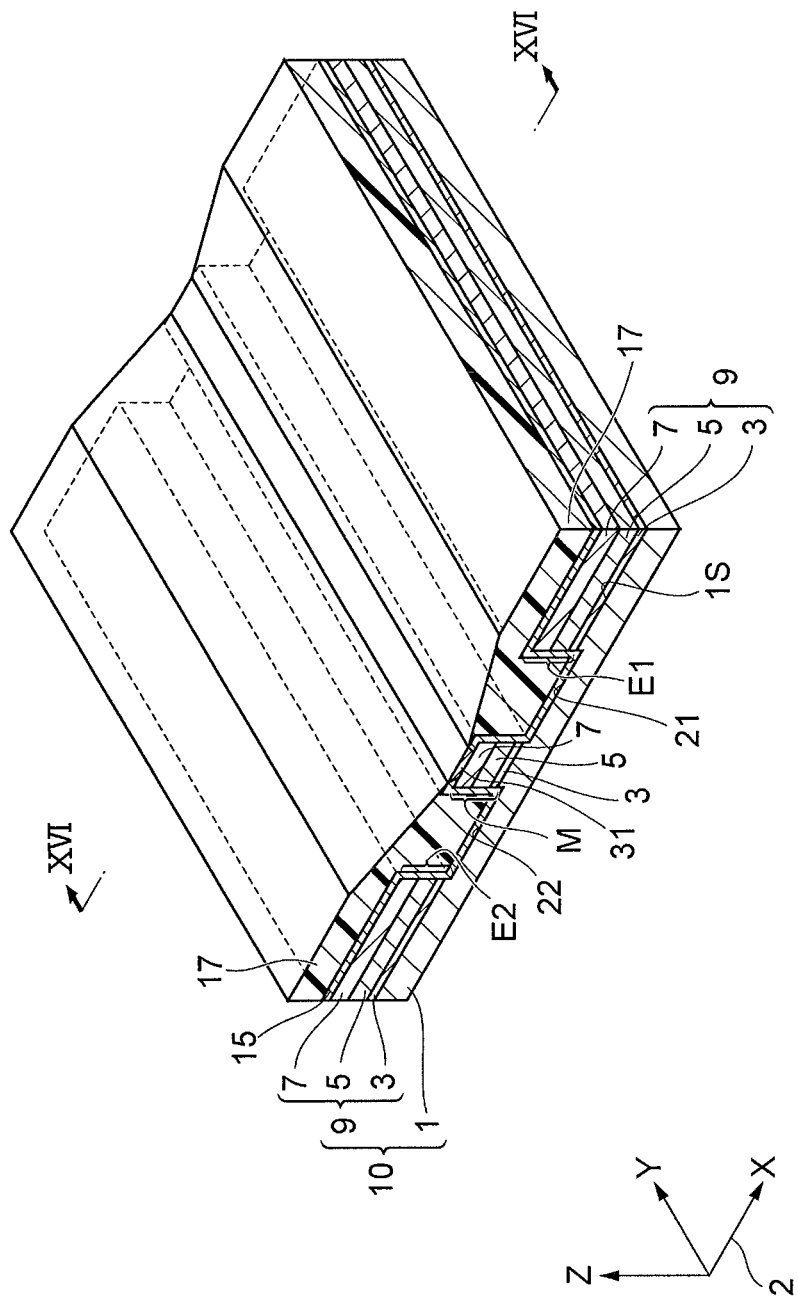
FIG. 15 is a perspective view illustrating an upper electrode formation step.
Figure 16:
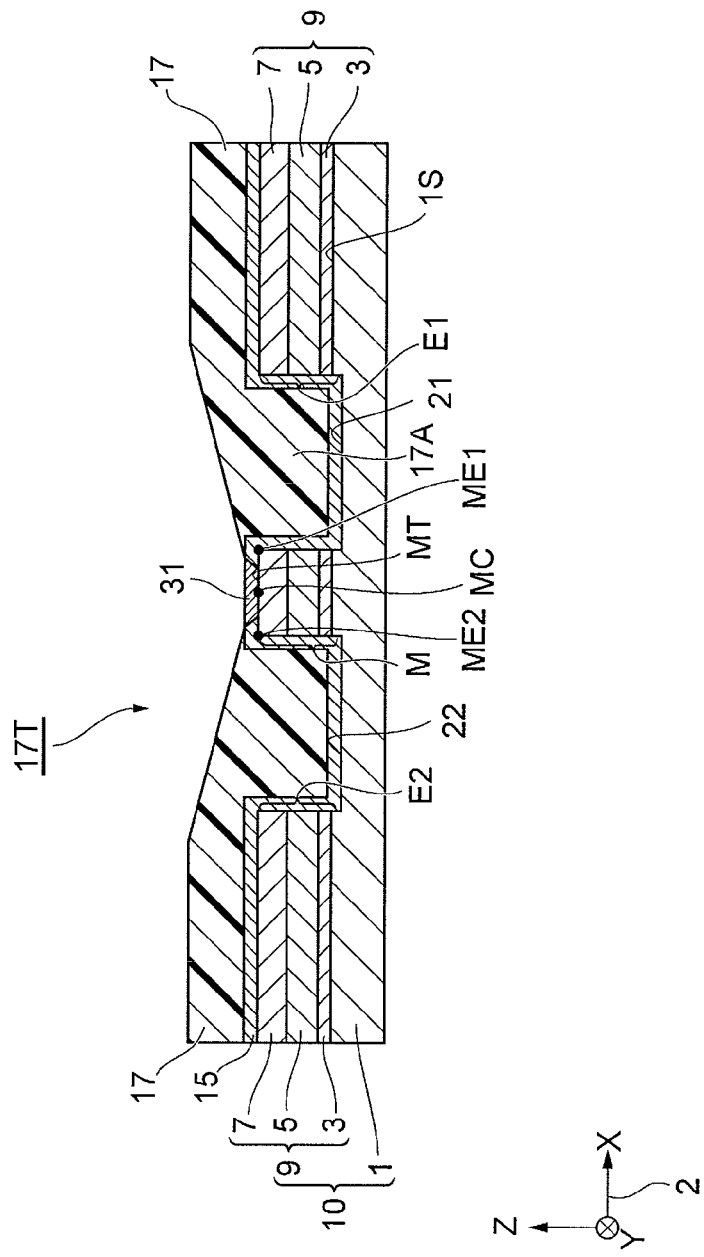
FIG. 16 is a cross-sectional view taken along line XVI-XVI in FIG. 15.

Next, the upper electrode formation step is performed. FIG. 15 is a perspective view illustrating the upper electrode formation step. FIG. 16 is a cross-sectional view taken along line XVI-XVI in FIG. 15.

In this step, as illustrated in FIGS. 15 and 16, an upper electrode 31 is formed by, for example, an evaporation method on the exposed top surface MT of the mesa portion M through the opening. The upper electrode 31 extends in the Y-axis direction, as with the mesa portion M. The upper electrode 31 is formed of, for example, a Au/Zn/Au stacked metal layer. The upper electrode 31 forms an ohmic contact with the mesa portion M. The upper electrode 31 is in direct contact with the upper cladding layer 7 of the mesa portion M. Alternatively, in the semiconductor structure formation step, a contact layer composed of a III-V group compound semiconductor, for example, InGaAsP or InGaAs, may be formed on the upper cladding layer 7 at the time of the formation of the stacked semiconductor layer 9, and then the upper electrode 31 may be formed on the contact layer.

Electrical Interconnection Formation Step

Figure 17:
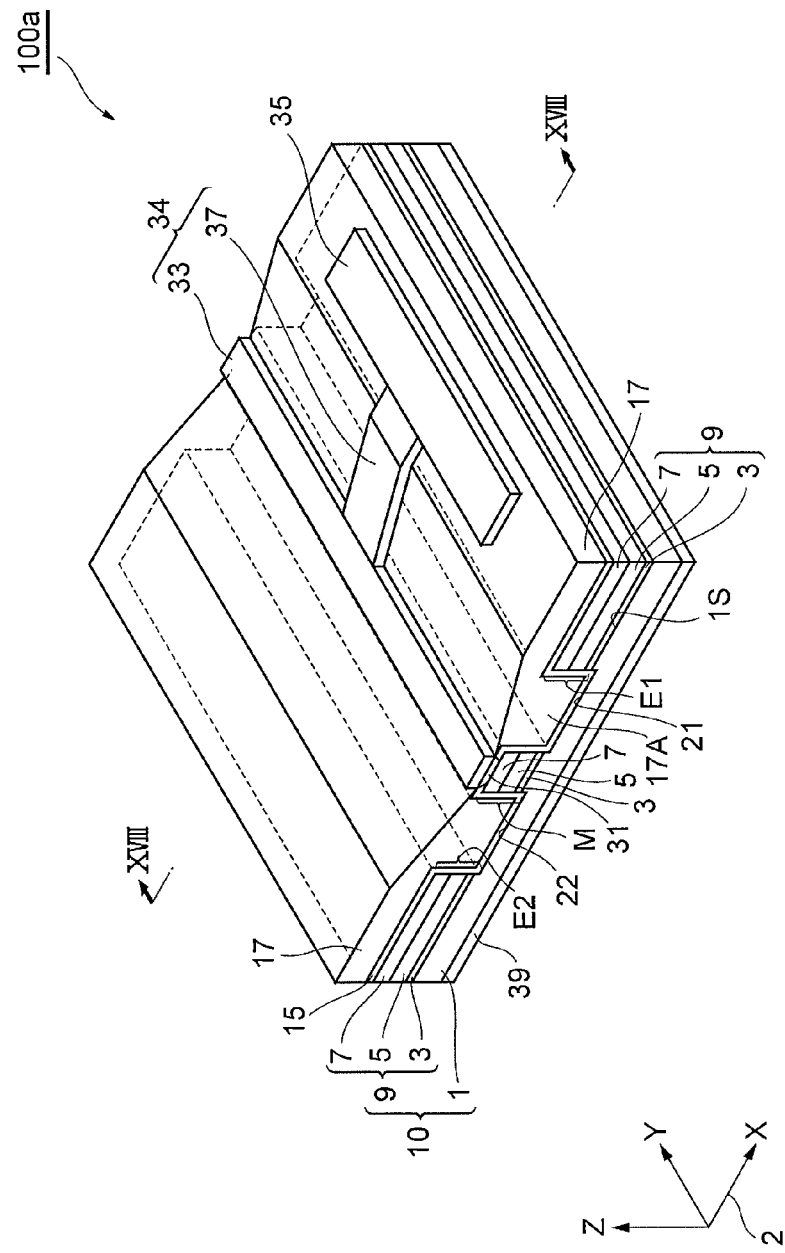
FIG. 17 is a perspective view illustrating an electrical interconnection formation step.
Figure 18:
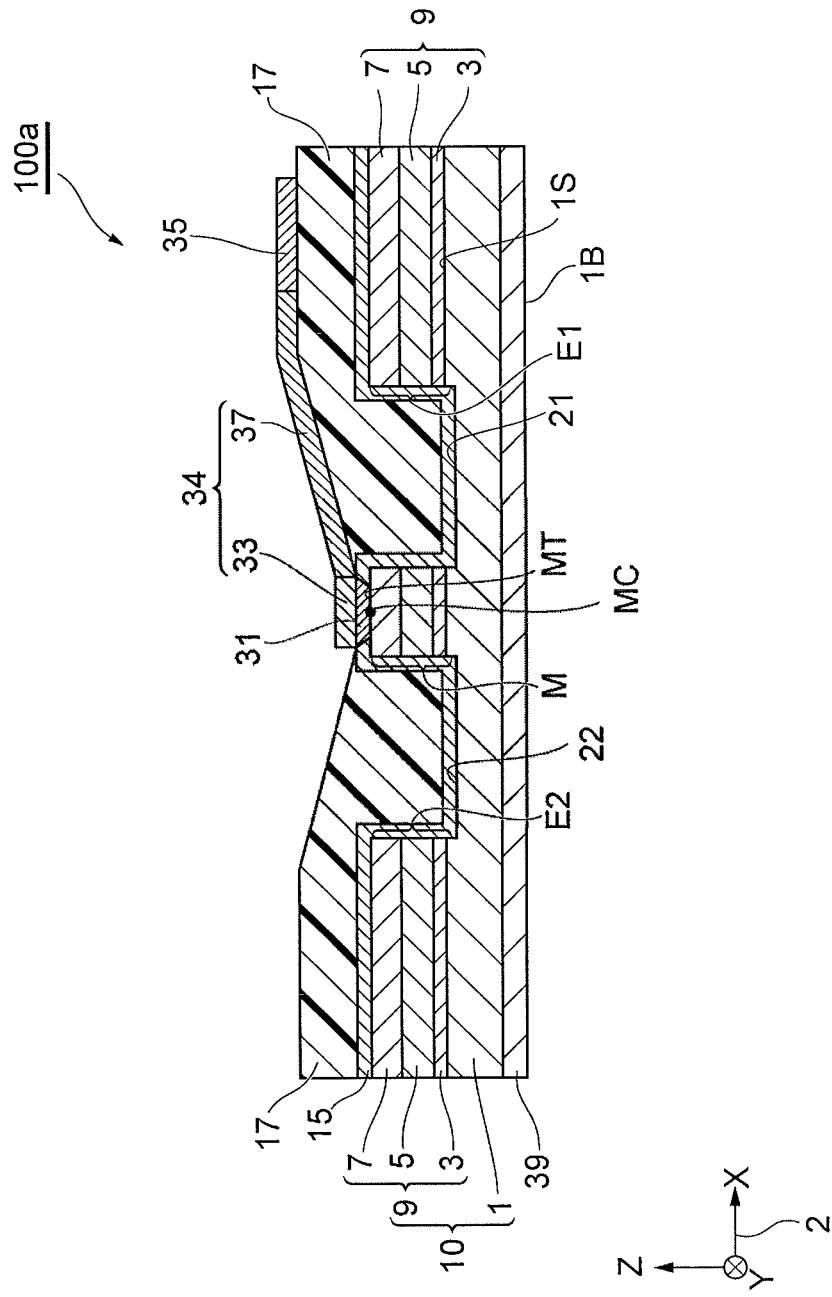
FIG. 18 is a cross-sectional view taken along line XVIII-XVIII in FIG. 17.

Subsequently, the electrical interconnection formation step is performed. FIG. 17 is a perspective view illustrating the electrical interconnection formation step. FIG. 18 is a cross-sectional view taken along line XVIII-XVIII in FIG. 17 (a cross-sectional view in a plane orthogonal to the Y-axis).

In this step, as illustrated in FIGS. 17 and 18, an electrical interconnection 34 including a first region 33 and a second region 37, and a bonding pad 35 are formed. The electrical interconnection 34 and the bonding pad 35 are composed of metal materials.

The first region 33 of the electrical interconnection 34 is formed on the upper electrode 31 and extends in the Y-axis direction, as with the upper electrode 31. The bonding pad 35 is formed on a region of the resin portion 17 above the first external region E1. The second region 37 of the electrical interconnection 34 is formed on at least a region 17A of the resin portion 17 in the first stripe-shaped groove 21 so as to electrically connect the first region 33 to the bonding pad 35. Specifically, in this embodiment, the second region 37 of the electrical interconnection 34 extends from the first region 33 to the bonding pad 35 through the region 17A of the resin portion 17 in the first stripe-shaped groove 21 and the region of the resin portion 17 above the first external region E1.

The electrical interconnection 34 and the bonding pad 35 may be formed by, for example, an evaporation method or a plating method. Specifically, Ti/Pt/Au layers, which serve as part of the first region 33 and the electrical interconnection 34, are formed in that order by the evaporation method. Then a Au layer, which serves as the remainder of the first region 33 and the electrical interconnection 34, is further formed on the Au layer by a plating method. By performing this process, the electrical interconnection 34 and the bonding pad 35 may be formed.

The back surface 1B of the semiconductor substrate 1 is polished until the thickness of the semiconductor substrate 1 is reduced to about 100 μm. A lower electrode 39 is then formed on the back surface 1B. Heat treatment results in the formation of an ohmic contact between the upper electrode 31 and the mesa portion M and an ohmic contact between the lower electrode 39 and the semiconductor substrate 1. Cleavage of the structure 10 along the XZ plane forms mirrors for a laser cavity on both facets in the Y-axis direction. The structure 10 is cut at a predetermined position in the XY plane into a chip. The foregoing steps are performed to provide a semiconductor laser 100a as illustrated in FIGS. 17 and 18.

In the foregoing method for producing an optical semiconductor device according to this embodiment, part of the resin portion 17 and the protective film 15 are simultaneously etched so as to expose the top surface MT of the mesa portion M by an etching method that satisfies the relational expression R>1 in the simultaneous etching substep. That is, part of the resin portion 17 and the protective film 15 are simultaneously etched so as to expose the top surface MT of the mesa portion M by an etching method such that the etch rate $r_1$ of the protective film 15 is lower than the etch rate $r_2$ of the resin portion 17 (see FIGS. 11 to 14).

In the resin portion formation step, the resin portion 17 is formed in such a manner that in a cross section orthogonal to the Y-axis direction, the top surface 17T of the resin portion 17 includes the first inclined surface region 17S1 that rises from the first point P1 above the mesa portion M toward the second point P2 above the first stripe-shaped groove 21 (see FIGS. 7 and 8). A thickness of the resin portion 17 measured from the main surface 1S of the semiconductor substrate 1 before the formation of the first stripe-shaped groove 21 to the first inclined surface region 17S1 in the Z-axis direction increases from the first point P1 toward the second point P2. Furthermore, immediately after the resin portion formation step, in a cross section orthogonal to the Y-axis direction, letting a value of the interior angle θ1 formed by the meeting of the X-axis direction with the first inclined surface region 17S1 be θ, letting the thickness of the region 15A of the protective film 15 on the top surface MT of the mesa portion M be d, and letting the width of the top surface MT of the mesa portion M in the X-axis direction be w, the relational expression tan θ≥2 dR/w is satisfied (see FIGS. 7 and 8). Here, the etch rate ratio R is represented by an etch rate ratio $r_2/r_1$, wherein $r_1$ represents the etch rate of the protective film 15, and $r_2$ represents the etch rate of the resin portion 17.

Thus, in a cross section orthogonal to the Y-axis direction, with respect to the position of the main surface 1S of the semiconductor substrate 1 before the formation of the first stripe-shaped groove 21 and the second stripe-shaped groove 22, the height of the first inclined surface region 17S1 of the resin portion 17 immediately after the resin portion formation step increases by dR or more when a point shifts by w/2 in the direction of the X-axis (see FIGS. 7 and 8). In the simultaneous etching substep, the resin portion is etched by dR while the protective film 15 is etched by the thickness d.

Accordingly, in a cross section orthogonal to the Y-axis direction, when the protective film 15 above a point (in this embodiment, the midpoint MC) in the top surface MT of the mesa portion M is just completely etched in the simultaneous etching substep, the resin portion 17 is left or is just completely etched above a point (in this embodiment, one end point ME1) distant from the point (in this embodiment, the midpoint MC) in the top surface MT of the mesa portion M by w/2 in the direction of the X-axis because the resin portion 17 in the first stripe-shaped groove 21 has the thickness increasing from the first point P1 toward the second point P2, the thickness being measured between the main surface 1S of the semiconductor substrate 1 before the formation of the first stripe-shaped groove 21 and the first inclined surface region 17S1 (see FIG. 10). Here, the first inclined surface region 17S1 has the interior angle θ1 which is more than or equal to arctan (2 dR/w). Thereby, the top surface of the region 17A of the resin portion 17 in the first stripe-shaped groove 21 is not lower than the top surface MT of the mesa portion M after the simultaneous etching substep (see FIG. 14). As a result, it is possible to prevent or inhibit the formation of a step that is lowered from top surface MT of the mesa portion M toward the region 17A of the resin portion 17, the step being located between the top surface MT of the mesa portion M and the top surface of the region 17A of the resin portion 17 (see FIG. 14).

In the method for producing an optical semiconductor device according to this embodiment, it is possible to form the second region 37 of the electrical interconnection 34 on the region 17A of the resin portion 17 free from such a step described above in the electrical interconnection formation step, thereby suppressing the breaking of the electrical interconnection 34 (see FIGS. 17 and 18).

In the method for producing an optical semiconductor device according to this embodiment, in the resin portion formation step, the top surface 17T of the resin portion 17 includes the first inclined surface region 17S1 which rises from the first point P1 toward the second point P2 and which rises from the second point P2 toward the third point P3 above the first external region E1 in a cross section orthogonal to the Y-axis direction (see FIGS. 7 and 8).

The first inclined surface region 17S1 extends from the first point P1 above the mesa portion M to the third point P3 above the first external region E1. Thus, even if the second region 37 of the electrical interconnection 34 is formed so as to extend to the first external region E1, it is possible to suppress the breaking of the electrical interconnection 34 (see FIGS. 17 and 18).

In the method for producing an optical semiconductor device according to this embodiment, the resin portion 17 is preferably composed of bisbenzocyclobutene or polyimide. The protective film 15 is composed of a material that can be etched by a reactive ion etching method using a gas mixture of $CF_4$ gas and $O_2$ gas as an etching gas. The etching in the resin portion etching substep and the simultaneous etching substep is performed by a reactive ion etching method using a gas mixture of $CF_4$ gas and $O_2$ gas as an etching gas (see FIGS. 9 to 14).

That is, it is possible to perform the resin portion etching substep and the simultaneous etching substep in the etching step by only one etching method, i.e., a reactive ion etching method using a gas mixture of $CF_4$ gas and $O_2$ gas as an etching gas, thereby increasing the production throughput of the optical semiconductor device.

In the method for producing an optical semiconductor device according to this embodiment, letting the width L21 of the first stripe-shaped groove 21 in the X-axis direction and the width L22 of the second stripe-shaped groove 22 in the X-axis direction be z, and letting the width of the top surface MT of the mesa portion M in the X-axis direction be w, the value of z/w is preferably 1.5 or more and 6.0 or less (see FIG. 5).

When the value of z/w is 1.5 or more, the width L21 and the width L22 of the first stripe-shaped groove 21 and the second stripe-shaped groove 22, respectively, in the X-axis direction are sufficiently large. Thus, in the resin portion formation step, it is possible to easily form the resin portion 17 having the inclined top surface 17T that rises from a position above the mesa portion M toward the outside in the X-axis direction (see FIGS. 7 and 8).

When the value of z/w is 6.0 or less, the width L21 and the width L22 of the first stripe-shaped groove 21 and the second stripe-shaped groove 22, respectively, in the X-axis direction are sufficiently small. Thus, in the resin portion formation step, it is possible to inhibit the formation of the resin portion 17 having the inclined top surface 17T that is lowered from a position above the mesa portion M toward the outside in the X-axis direction (see FIGS. 7 and 8). Hence, the resin portion 17 is easily formed in the resin portion formation step in such a manner that in a cross section orthogonal to the Y-axis direction, the top surface 17T of the resin portion 17 has the first inclined surface region 17S1 that rises from the first point P1 above the mesa portion M toward the second point P2 above the first stripe-shaped groove 21 (see FIGS. 7 and 8).

Second Embodiment

A method for producing an optical semiconductor device according to a second embodiment will be described below. In the second embodiment, points different from the first embodiment will be mainly described. Portions where descriptions are omitted and elements having the same reference numerals as in the first embodiment are the same as in the first embodiment unless otherwise specified.

In the method for producing an optical semiconductor device according to the second embodiment, steps until the resin portion formation step (see FIGS. 7 and 8) are the same as those in the first embodiment. An etching step differs from the etching step in the first embodiment.

Resin Portion Etching Substep

Figure 19:
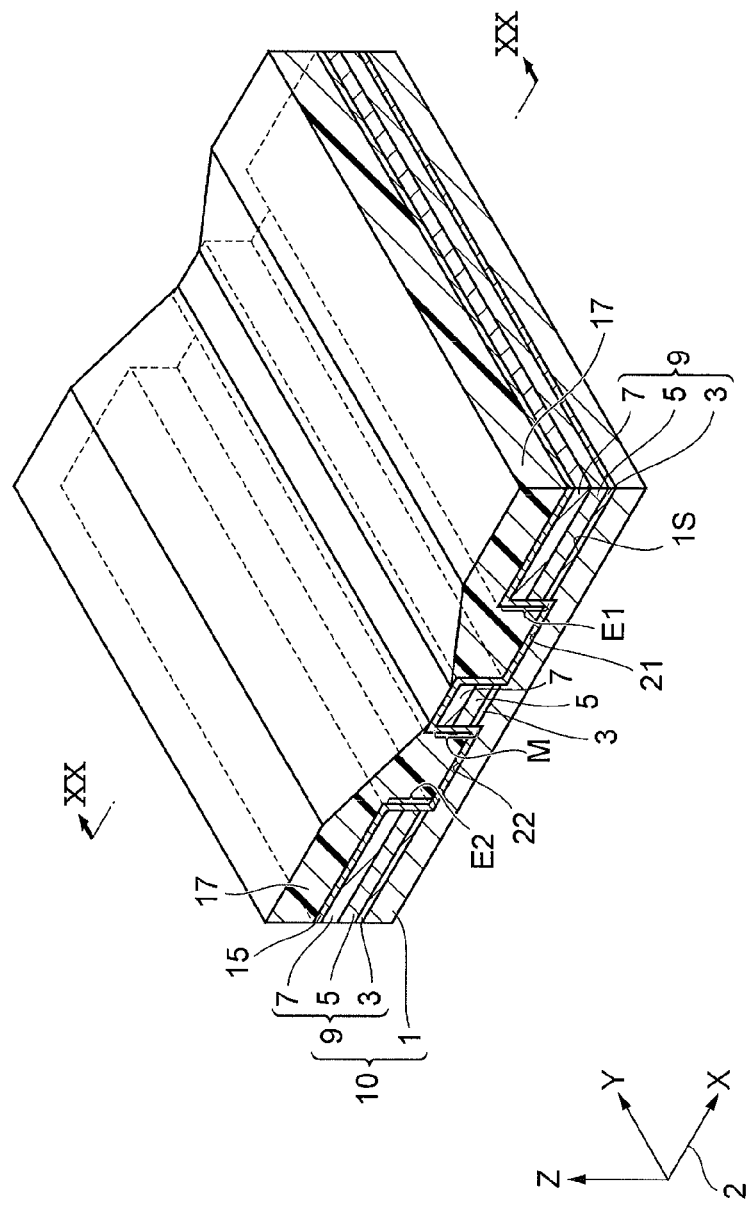
FIG. 19 is a perspective view illustrating a resin portion etching substep.
Figure 20:
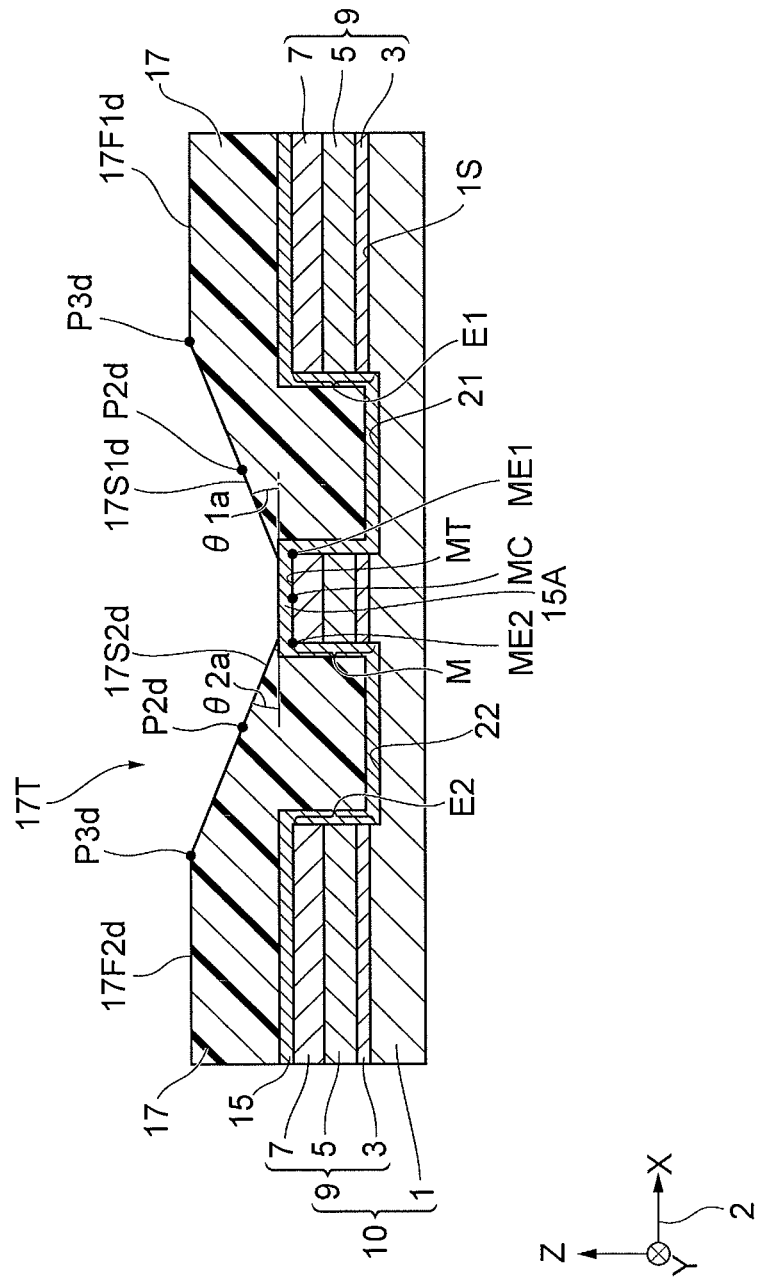
FIG. 20 is a cross-sectional view taken along line XX-XX in FIG. 19.

FIG. 19 is a perspective view illustrating the resin portion etching substep of the etching step according to this embodiment. FIG. 20 is a cross-sectional view taken along line XX-XX in FIG. 19 (a cross-sectional view in a plane orthogonal to the Y-axis). FIGS. 19 and 20 illustrate a state immediately after the completion of the resin portion etching substep according to this embodiment.

According to this embodiment, the resin portion 17 is composed of a fluorine-containing resin. The protective film 15 is composed of a material that is not substantially etched by a reactive ion etching method using $O_2$ gas as an etching gas. The protective film 15 is formed of a dielectric film composed of, for example, silicon dioxide ($SiO_2$) or silicon nitride (SiN).

In the resin portion etching substep, as illustrated in FIGS. 19 and 20, the top surface 17T of the resin portion 17 is selectively etched by a reactive ion etching method using $O_2$ gas as an etching gas to lower the first inclined surface region 17S1, the second inclined surface region 17S2, the first external surface region 17F1, and the second external surface region 17F2 (see FIG. 8) in the negative direction of the Z-axis, thereby exposing a region of the protective film 15 on the top surface MT of the mesa portion M. The protective film 15 is not substantially etched during the etching. Thus, this etching enables a large exposed area of the region 15A of the protective film 15 on the top surface MT of the mesa portion M, compared with the first embodiment.

In FIG. 20, a first inclined surface region 17S1*d* is the first inclined surface region 17S1 that has been lowered in the Z-axis direction (see FIG. 8). A second inclined surface region 17S2*d* is the second inclined surface region 17S2 that has been lowered in the Z-axis direction (see FIG. 8). A first external surface region 17F1*d* is the first external surface region 17F1 that has been lowered in the Z-axis direction (see FIG. 8). A second external surface region 17F2*d* is the second external surface region 17F2 that has been lowered in the Z-axis direction (see FIG. 8).

The etching of the resin portion 17 in the resin portion etching substep according to this embodiment is also performed in such a manner that the first inclined surface region 17S1*a* and the second inclined surface region 17S2*a* come into contact with the region 15A of the protective film 15 after the completion of the etching As illustrated in FIG. 20, the etching of the resin portion 17 in this substep according to this embodiment is performed in such a manner that end points P1*d* of the first inclined surface region 17S1*d* and the second inclined surface region 17S2*d* adjacent to the mesa portion M come into contact with the region 15A of the protective film 15.

Simultaneous Etching Substep

Figure 21:
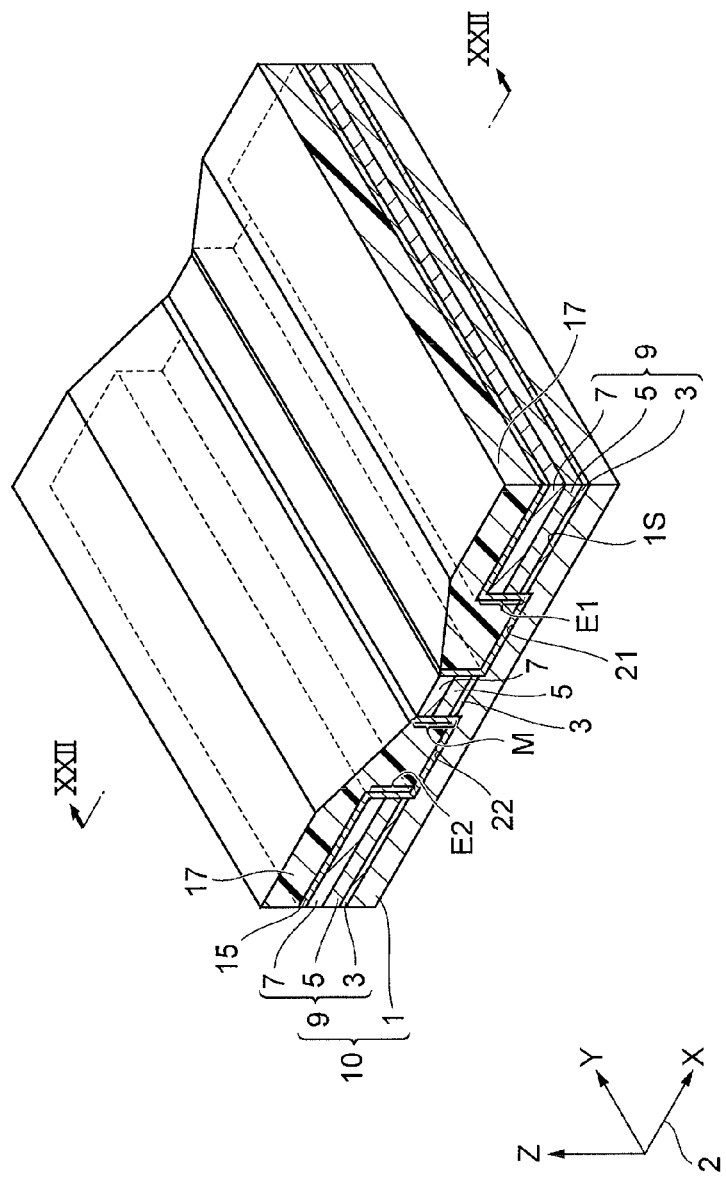
FIG. 21 is a perspective view illustrating a simultaneous etching substep.
Figure 22:
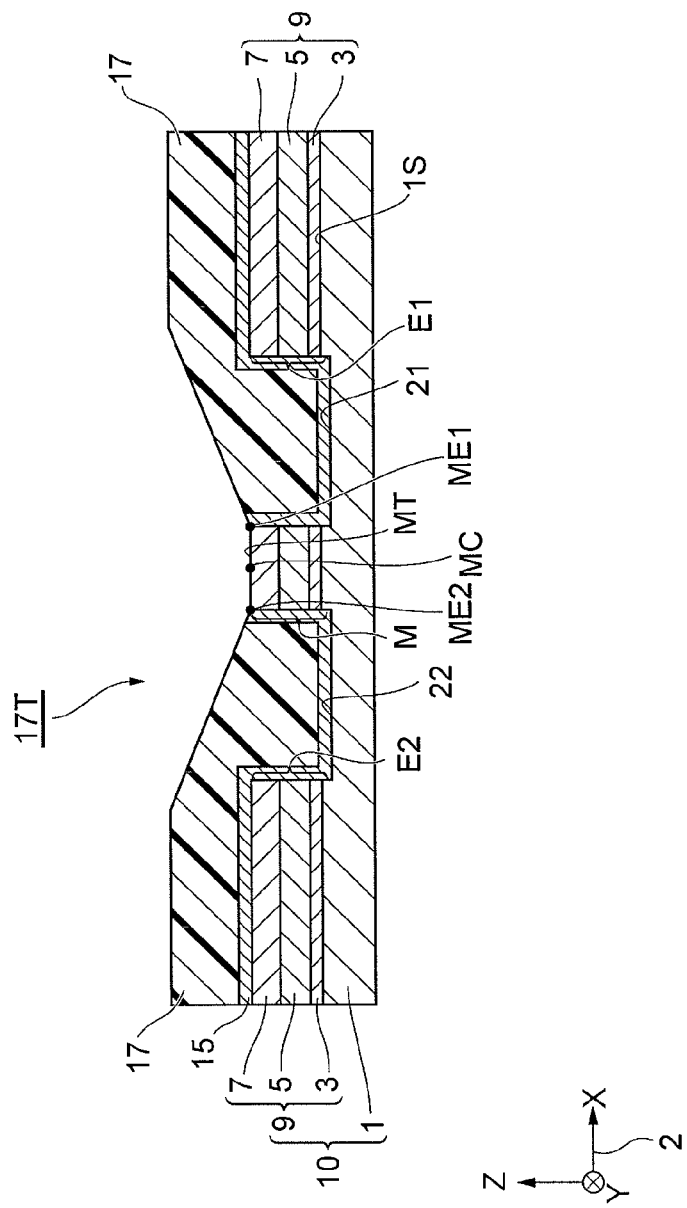
FIG. 22 is a cross-sectional view taken along line XXII-XXII in FIG. 21.

Subsequently, the simultaneous etching substep is performed. FIG. 21 is a perspective view illustrating the simultaneous etching substep according to this embodiment. FIG. 22 is a cross-sectional view taken along line XXII-XXII in FIG. 21 (a cross-sectional view in a plane orthogonal to the Y-axis).

In the simultaneous etching substep according to this embodiment, as with the first embodiment, letting the etch rate of the protective film 15 be $r_1$, letting the etch rate of the resin portion 17 be $r_2$, and letting the etch rate ratio R be $r_2/r_1$, the resin portion 17 and the protective film 15 are simultaneously etched by an etching method that satisfies the relational expression R>1.

As such an etching method, a dry etching process, such as a reactive ion etching method, may be employed. In this embodiment, a reactive ion etching method using a gas mixture of $CF_4$ gas and $O_2$ gas as an etching gas is employed.

When the etching described above is performed, as illustrated in FIGS. 21 and 22, the exposed area of the region 15A of the protective film 15 is substantially uniformly etched to expose the top surface MT of the mesa portion M. Furthermore, the top surface 17T of the resin portion 17 is lowered in the negative direction of the Z-axis.

In this way, as with the first embodiment, in the etching step according to this embodiment, part of the resin portion 17 and the region 15A of the protective film 15 on the top surface MT of the mesa portion M are etched so as to expose the top surface MT of the mesa portion M.

Figure 23:
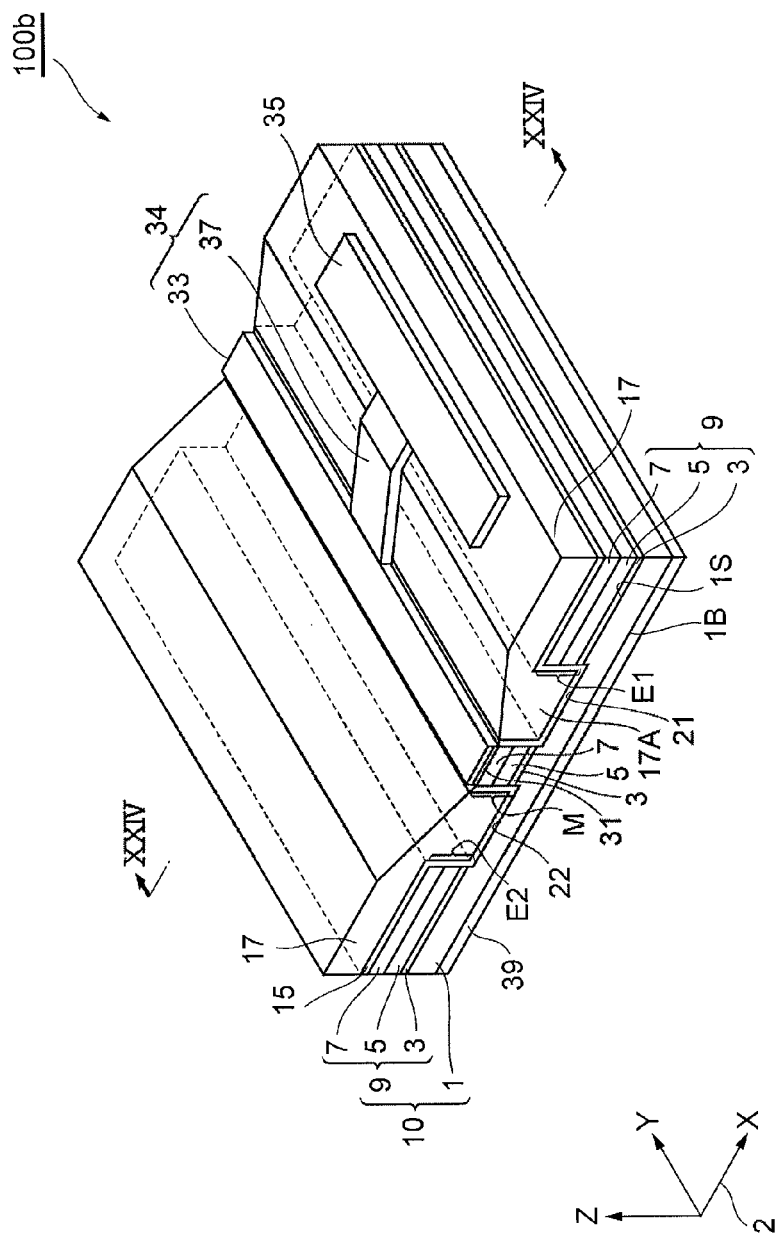
FIG. 23 is a perspective view illustrating a step after the etching step.
Figure 24:
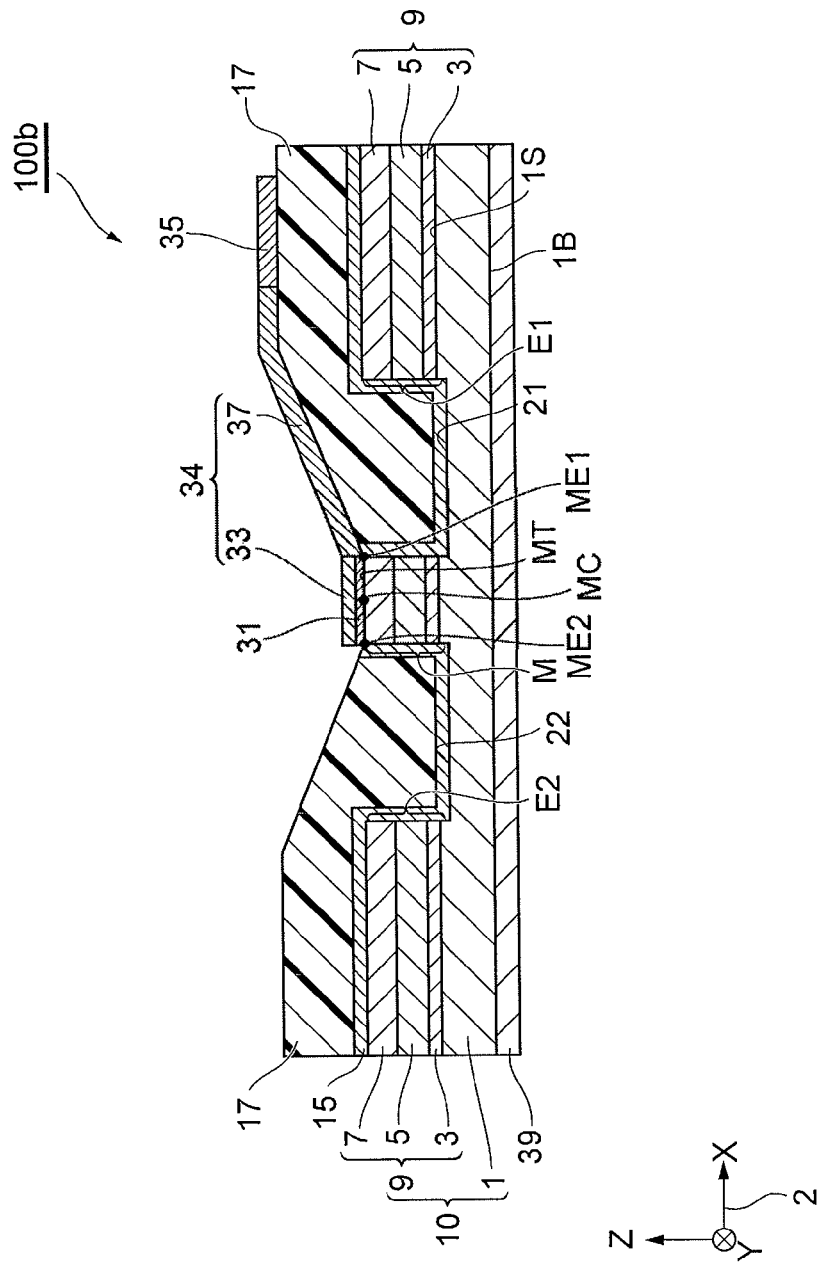
FIG. 24 is a cross-sectional view taken along line XXIV-XXIV in FIG. 23.

FIG. 23 is a perspective view illustrating steps after the etching step according to this embodiment. FIG. 24 is a cross-sectional view taken along line XXIV-XXIV in FIG. 23 (a cross-sectional view in a plane orthogonal to the Y-axis).

As with the first embodiment, after the foregoing etching step, the upper electrode formation step and the electrical interconnection formation step are performed to provide a semiconductor laser 100b as illustrated in FIGS. 23 and 24.

In the foregoing method for producing an optical semiconductor device according to this embodiment, it is possible to suppress the breaking of the electrical interconnection 34 for the same reason as in the first embodiment.

In the method for producing an optical semiconductor device according to this embodiment, the resin portion 17 is composed of a fluorine-containing resin. The protective film 15 is composed of a material that is not substantially etched by a reactive ion etching method using $O_2$ gas as an etching gas. In the resin portion etching substep, part of the resin portion 17 is etched by a reactive ion etching method using $O_2$ gas as an etching gas, thereby exposing the region 15A of the protective film 15 on the top surface MT of the mesa portion M (see FIGS. 19 and 20).

Accordingly, after the top surface of the protective film 15 is sufficiently exposed without etching the protective film 15 in the resin portion etching substep, the simultaneous etching substep is performed (see FIGS. 19 to 22). As a result, the protective film 15 is more uniformly etched in the simultaneous etching substep, thereby improving the shape controllability of the mesa portion M.

The present invention is not limited to the foregoing embodiments. Various modifications may be made.

For example, in each of the foregoing embodiments, the first inclined surface region 17S1 rises from the first point P1 above the mesa portion M toward the second point P2 above the first stripe-shaped groove 21 and rises from the second point P2 toward the third point P3 above the first external region E1 (see FIG. 8). The second inclined surface region 17S2 rises from the first point P1 above the mesa portion M toward the second point P2 above the second stripe-shaped groove 22 and rises from the second point P2 toward the third point P3 above the second external region E2 (see FIG. 8). However, the first inclined surface region 17S1 and/or the second inclined surface region 17S2 may rise only from the first point P1 to the second point P2. In other words, the first inclined surface region 17S1 and/or the second inclined surface region 17S2 may extend from the first point P1 to the second point P2 and may not extend from the second point P2 to the third point P3. Also in this case, according to the present invention, it is possible to suppress the breaking of the electrical interconnection 34 for the same reasons described in the foregoing embodiments.

In the foregoing embodiments, the present invention is applied to the semiconductor lasers. The present invention may also be applied to waveguide-type optical semiconductor devices, such as optical modulators, semiconductor optical amplifiers, light-sensitive elements, other than semiconductor lasers.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for producing an optical semiconductor device, said method comprising the steps of:

forming a semiconductor structure including a stacked semiconductor layer;

forming a mask on the semiconductor structure, the mask having a first opening and a second opening, each of the first opening and the second opening extending in a first direction, the first opening and the second opening being separated from each other in a second direction orthogonal to the first direction;

etching the semiconductor structure with the mask to form a first stripe-shaped groove, a second stripe-shaped groove, a mesa portion, and external regions on the semiconductor structure, the mesa portion being located between the first stripe-shaped groove and the second stripe-shaped groove, the external regions being located on sides of the first and second stripe-shaped grooves opposite sides on which the mesa portion lies;

forming a protective film on a top surface and side surfaces of the mesa portion;

forming a resin portion on the protective film, the resin portion covering the mesa portion and the external regions, the first and second stripe-shaped grooves being filled with the resin portion;

etching the resin portion and the protective film formed on the top surface of the mesa portion until the top surface of the mesa portion is exposed;

forming an upper electrode on the exposed top surface of the mesa portion; and forming an electrical interconnection on the resin portion in the first stripe-shaped groove or the second stripe-shaped groove, the electrical interconnection being electrically connected to the upper electrode, wherein, in the step of forming the resin portion, the resin portion is formed to have an inclined surface region that rises from a first point above the mesa portion toward a second point above the first stripe-shaped groove in a cross section orthogonal to the first direction, and to satisfy the relational expression:

$\tan\theta \geq 2\, dR/w$ where, in a cross section orthogonal to the first direction, $\theta$ represents an interior angle formed by meeting of the second direction and the inclined surface region, d represents a thickness of the protective film on the top surface of the mesa portion, R represents a ration of an etch rate of the resin portion to an etch rate of the protective film, and w represents a width of the top surface of the mesa portion in the second direction, and wherein the step of etching the resin portion and the protective film includes the substeps of
  etching the resin portion until the inclined surface region comes into contact with the protective film, and
  simultaneously etching the resin portion and the protective film with an etch rate of the resin portion being larger than an etch rate of the protective film.

2. The method according to claim 1,
wherein, in the step of forming the resin portion, the inclined surface region of the resin portion rises from the first point toward a third point above a corresponding one of the external regions through the second point.

3. The method according to claim 1, wherein
the protective film is composed of a material that is etched by a reactive ion etching method using a gas mixture of $CF_4$ gas and $O_2$ gas as an etching gas, and
the etching in the substep of etching the resin portion and the substep of simultaneously etching the resin portion and the protective film is performed by a reactive ion etching method using a gas mixture of $CF_4$ gas and $O_2$ gas as an etching gas.

4. The method according to claim 3, wherein
the resin portion is composed of a bisbenzocyclobutene resin or a polyimide resin, and
the protective film is composed of a dielectric material.

5. The method according to claim 4, wherein
the protective film is composed of silicon oxide or silicon nitride.

6. The method according to claim 1, wherein
the protective film is composed of a material that is not substantially etched by a reactive ion etching method using $O_2$ gas as an etching gas, and
in the substep of etching the resin portion, the resin portion is selectively etched by a reactive ion etching method using $O_2$ gas as an etching gas until the protective film on the top surface of the mesa portion is exposed.

7. The method according to claim 6, wherein
the resin portion is composed of a fluorine-containing resin, and
the protective film is composed of a dielectric material.

8. The method according to claim 7, wherein
the protective film is composed of silicon oxide or silicon nitride, 9. The method according to claim 1, wherein
each of the first and second stripe-shaped grooves has a width larger than a width of the top surface of the mesa portion in the second direction, and
when the width of each of the first and second stripe-shaped grooves in the second direction is z, a ratio of z to w is 1.5 or more and 6.0 or less.

* * * * *